(12) United States Patent
Pampattiwar et al.

(10) Patent No.: US 11,536,762 B2
(45) Date of Patent: Dec. 27, 2022

(54) SYSTEM FOR DETECTING CIRCUIT ANOMALIES IN TRAILER WIRING

(71) Applicant: Grote Industries, Inc., Madison, IN (US)

(72) Inventors: Sankalp Pampattiwar, Madison, IN (US); Yogesh Kubal, Madison, IN (US); Shengjie Tang, Madison, IN (US); Cesar Perez-Bolivar, Madison, IN (US)

(73) Assignee: Grote Industries, Inc., Madison, IN (US)

( * ) Notice: Subject to any disclaimer, the term of this patent is extended or adjusted under 35 U.S.C. 154(b) by 509 days.

(21) Appl. No.: 16/695,957

(22) Filed: Nov. 26, 2019

(65) Prior Publication Data
US 2020/0174055 A1  Jun. 4, 2020

Related U.S. Application Data

(60) Provisional application No. 62/772,847, filed on Nov. 29, 2018.

(51) Int. Cl.
*H04J 3/06*     (2006.01)
*G01R 31/00*    (2006.01)
(Continued)

(52) U.S. Cl.
CPC ........... *G01R 31/007* (2013.01); *G07C 5/008* (2013.01); *G07C 5/0816* (2013.01); *H02B 1/20* (2013.01);
(Continued)

(58) Field of Classification Search
CPC ..... H04L 12/40013; H04L 2012/40215; H04L 2012/40273; H04L 12/40; G01R 31/007;
(Continued)

(56) References Cited

U.S. PATENT DOCUMENTS

| 5,739,592 A | 4/1998 | Rigsby et al. |
| 5,911,785 A * | 6/1999 | Czaja ............... H01L 21/67034 |
| | | 73/865.9 |

(Continued)

FOREIGN PATENT DOCUMENTS

| WO | WO 2018/044430 | 3/2018 |
| WO | WO 2018/156178 A1 | 8/2018 |

*Primary Examiner* — Stephen M D Agosta
(74) *Attorney, Agent, or Firm* — Woodard Emhardt Henry Reeves & Wagner LLP

(57) ABSTRACT

A system for detecting anomalies in electrical wiring in a truck trailer. The system measures and compares current drawn from the truck tractor with the current drawn by a circuit at a particular trailer component or other location in the trailer wiring. If the two current measurements differ in excess of a predetermined threshold, the system can report a wiring anomaly. The location of the anomaly can then be determined by performing the operation for different trailer components thus testing multiple different branches of the trailer power distribution circuit, and using the results of these tests to determine that an anomaly is present, and possibly the location of the issue. The system may then send a notification to a remote computing device, to the truck tractor, or any combination thereof.

20 Claims, 8 Drawing Sheets

(51) Int. Cl.
  *G07C 5/00* (2006.01)
  *G07C 5/08* (2006.01)
  *H02B 1/20* (2006.01)
  *H04L 12/40* (2006.01)

(52) U.S. Cl.
  CPC ............... *H04L 12/40013* (2013.01); *H04L 2012/40215* (2013.01); *H04L 2012/40273* (2013.01)

(58) Field of Classification Search
  CPC ...... G01R 31/006; G01R 31/44; G01R 31/58; H02B 1/20; G07C 5/008; G07C 5/0816
  See application file for complete search history.

(56) References Cited

U.S. PATENT DOCUMENTS

| | | | | |
|---|---|---|---|---|
| 6,130,487 | A * | 10/2000 | Bertalan | H05B 47/20 340/12.32 |
| 6,970,772 | B2 * | 11/2005 | Radtke | H04B 3/548 701/32.7 |
| 8,816,691 | B2 * | 8/2014 | Miller | G01R 31/44 324/414 |
| 8,947,096 | B1 | 2/2015 | Wolf | |
| 9,018,958 | B2 | 4/2015 | Bertness | |
| 9,255,955 | B2 | 2/2016 | Bertness | |
| 9,434,308 | B2 | 9/2016 | Bean | |
| 9,575,091 | B2 * | 2/2017 | Reeder, III | G01R 1/0408 |
| 9,834,133 | B2 | 12/2017 | Bean | |
| 10,065,563 | B2 * | 9/2018 | Cornelius | B60Q 11/005 |
| 10,093,232 | B2 * | 10/2018 | Troutman | B60T 17/221 |
| 10,164,392 | B1 * | 12/2018 | Scheim | B60D 1/64 |
| 10,207,642 | B2 * | 2/2019 | Bean | H01R 9/18 |
| 10,271,411 | B2 * | 4/2019 | Troutman | H05B 45/50 |
| 10,352,978 | B2 * | 7/2019 | Johnson | G01R 31/007 |
| 10,388,161 | B2 * | 8/2019 | Troutman | G07C 5/12 |
| 10,442,400 | B2 * | 10/2019 | Dallos, Jr. | B08B 1/001 |
| 10,473,555 | B2 * | 11/2019 | Bertness | G01M 17/007 |
| D869,307 | S * | 12/2019 | Barber | D10/78 |
| 10,502,772 | B2 * | 12/2019 | Slade | G07C 5/08 |
| 10,688,839 | B1 * | 6/2020 | Slade | H04W 76/14 |
| 10,710,496 | B2 * | 7/2020 | Dixon | B62D 65/005 |
| 10,756,924 | B2 * | 8/2020 | Sarabia | H04L 63/08 |
| 10,858,053 | B2 * | 12/2020 | Bean | H04L 12/4625 |
| 2003/0057955 | A1 * | 3/2003 | Gumbel | G01R 31/007 324/504 |
| 2004/0224630 | A1 * | 11/2004 | MacFarland | H04L 67/12 455/11.1 |
| 2007/0057676 | A1 * | 3/2007 | Bourgeois | G01R 31/44 324/528 |
| 2007/0069734 | A1 * | 3/2007 | Bertness | G01R 31/3648 324/411 |
| 2007/0285100 | A1 * | 12/2007 | Hart | G01R 31/006 324/504 |
| 2008/0129307 | A1 | 6/2008 | Yu | |
| 2009/0009304 | A1 * | 1/2009 | Lacasse | G01R 31/006 340/431 |
| 2009/0219148 | A1 * | 9/2009 | Thomas | B60R 16/0315 340/431 |
| 2013/0159466 | A1 * | 6/2013 | Mao | H04L 67/566 709/218 |
| 2015/0362544 | A1 | 12/2015 | Bean | |
| 2016/0054365 | A1 * | 2/2016 | Cooper | G01R 31/006 324/504 |
| 2016/0121792 | A1 | 5/2016 | Christopherson et al. | |
| 2016/0214551 | A1 | 7/2016 | Armacost | |
| 2017/0240125 | A1 * | 8/2017 | Weigert | H04L 27/0002 |
| 2018/0059161 | A1 * | 3/2018 | Slade | B60Q 1/00 |
| 2018/0265001 | A1 | 9/2018 | Bean et al. | |

* cited by examiner

SYSTEM FOR DETECTING CIRCUIT ANOMALIES IN TRAILER WIRING

CROSS-REFERENCE TO RELATED APPLICATIONS

This application claims the benefit of U.S. Provisional Patent Application No. 62/772,847 filed Nov. 29, 2018 which is hereby incorporated by reference.

BACKGROUND

Anomalies in trailer power distribution circuits are a common cause of recurring operational failures in truck trailers. For example, corrosion in trailer wiring may cause critical trailer components in the trailer to fail to activate, activate at the wrong time, or activate intermittently thus causing malfunctions. Furthermore, trouble-shooting these issues can be a difficult and time-consuming process, and may require expensive remediation efforts. Replacing those portions of the trailer power distribution cabling that may be involved often requires significant downtime and extensive labor and material costs.

SUMMARY

Disclosed is a system for detecting anomalies in electrical wiring in a truck trailer. In general, the disclosed concepts are directed to comparing current drawn from the truck tractor with the current drawn by a circuit at different locations around the trailer, such as at each trailer component. If the current measurements differ by more than some threshold amount, the system can report a wiring anomaly. The location of the anomaly can be determined by performing this operation for different trailer components or other locations in the circuit thus testing multiple different branches of the circuit. By testing each branch or component systematically, the location of the anomaly may be pinpointed.

In one aspect, the system may include a master current measuring circuit that may be configured to measure a master current indicating current received from a truck tractor. The master current measuring circuit may be electrically connected upstream from a power distribution circuit of the trailer. One or more slave current measuring circuits may be electrically connected to the power distribution circuit downstream from the master current measuring circuit and upstream from one or more trailer components electrically connected to the power distribution circuit.

In another aspect, the slave current measuring circuits may be linked to the master current measuring circuit via an internal communications link electrically connected to individual trailer components of the one or more trailer components. The slave current measuring circuit(s) may be configured to measure a slave current indicating current passing through the slave current measuring circuit.

In another aspect, the master current measuring circuit may be configured to command the one or more slave current measuring circuits to separately measure the slave current, measure the master current, and to optionally generate a notification of a circuit anomaly when a difference between the master current and the slave current of one or more individual circuits, or branches of a circuit, is greater than a predetermined threshold value.

In another aspect, the master current measuring circuit may include a master shunt resistor electrically connected in series upstream from the power distribution circuit, and a master microcontroller. In this example, the master current measuring circuit may include a first input electrically connected to a first end of the master shunt resistor, and a second input electrically connected to a second end of the master shunt resistor. The master microcontroller may be configured to measure current passing through the master shunt resistor.

In another aspect, the one or more slave current measuring circuits may include a switching device configured to selectively divert power from an individual branch of the power distribution circuit to a test load. In this example, the slave shunt resistor may be electrically connected in series downstream from the test load. The slave microcontroller may include a first input electrically connected to a first end of the slave shunt resistor, and a second input electrically connected to a second end of the slave shunt resistor, and the slave microcontroller may be configured to measure current passing through the slave shunt resistor. In another aspect, the test load may include a resistance equivalent to an overall resistance of the one or more trailer components electrically connected to the power distributions circuit downstream from the slave current measuring circuit.

In another aspect, the one or more trailer components includes at least one LED lamp electrically connected to an individual portion or branch of the power distribution circuit. The switching device may be controlled by the slave microcontroller to selectively divert power from the at least one LED lamp to the test load.

In another aspect, the slave current measuring circuits may be configured to selectively disconnect power to one or more trailer components electrically connected to the power distribution circuit downstream from the slave current measuring circuit. In this example, the master current measuring circuit may be configured to measure the master current when power is disconnected from the one or more trailer components to establish a baseline leakage current for the power distribution circuit.

In another aspect, the system may include a nosebox mounted to the truck trailer that has terminals for connecting multiple separate power cables and a ground cable to a truck tractor. For example, the nosebox, power cables and ground cable, and/or the terminals may be arranged and configured according to the J-560 standard for truck and trailer wiring harnesses and connectors. The six separate master current measuring circuits may be electrically connected to the six separate power cables and to six separate power distribution circuits in the trailer. The six separate distribution circuits may be electrically connected to multiple one or more slave current measuring circuits. In one example, each power distribution circuit may by electrically connected to a single master current measuring circuit.

In another example, the system may include a nosebox mounted to the trailer with six separate power cables and a ground cable connected to the truck tractor. In this example, the master current measuring circuit receives power from one or more of the six separate power cables and supplies it to a single power distribution circuit electrically connected to the one or more trailer components.

In another aspect, the internal communications link may include two communication cables electrically connected to the master current measuring circuit. The master current measuring circuit may include a master Control Area Network (CAN) controller electrically connected to the communication cables. The slave current measuring circuit may include a slave CAN controller electrically connected to the two communication cables, and the master and slave current measuring circuits may communicate using a CAN protocol.

In another aspect, the master current measuring circuit may include a communication circuit configured to establish at least one external communication link with a remote computing device. The communication circuit may be configured to use the external communication link to send the notification to the remote computing device. In another aspect, the master current measuring circuit may be configured to send the notification to the truck tractor, such as by sending a signal to activate a warning light on the dashboard, or to activate the display of a warning message on a screen or other user interface component in the truck notifying the driver of a potential problem with the trailer wiring.

In another aspect, the at least one external communication link may include at least one of the following, or any combination thereof: A Bluetooth wireless communication link that sends the notification according to the Bluetooth protocol, a LoRa communication link that sends the notification according to the LoRa protocol, a communication link that conforms to the Institute of Electrical and Electronics Engineers (IEEE) 802.15.4 specification, a communication link that conforms to any one or more of the IEEE 802.11 family of wireless protocols, and/or a cellular telephone communication link.

Further forms, objects, features, aspects, benefits, advantages, and embodiments of the present invention will become apparent from a detailed description and drawings provided herewith.

DETAILED DESCRIPTION

Figure 1:
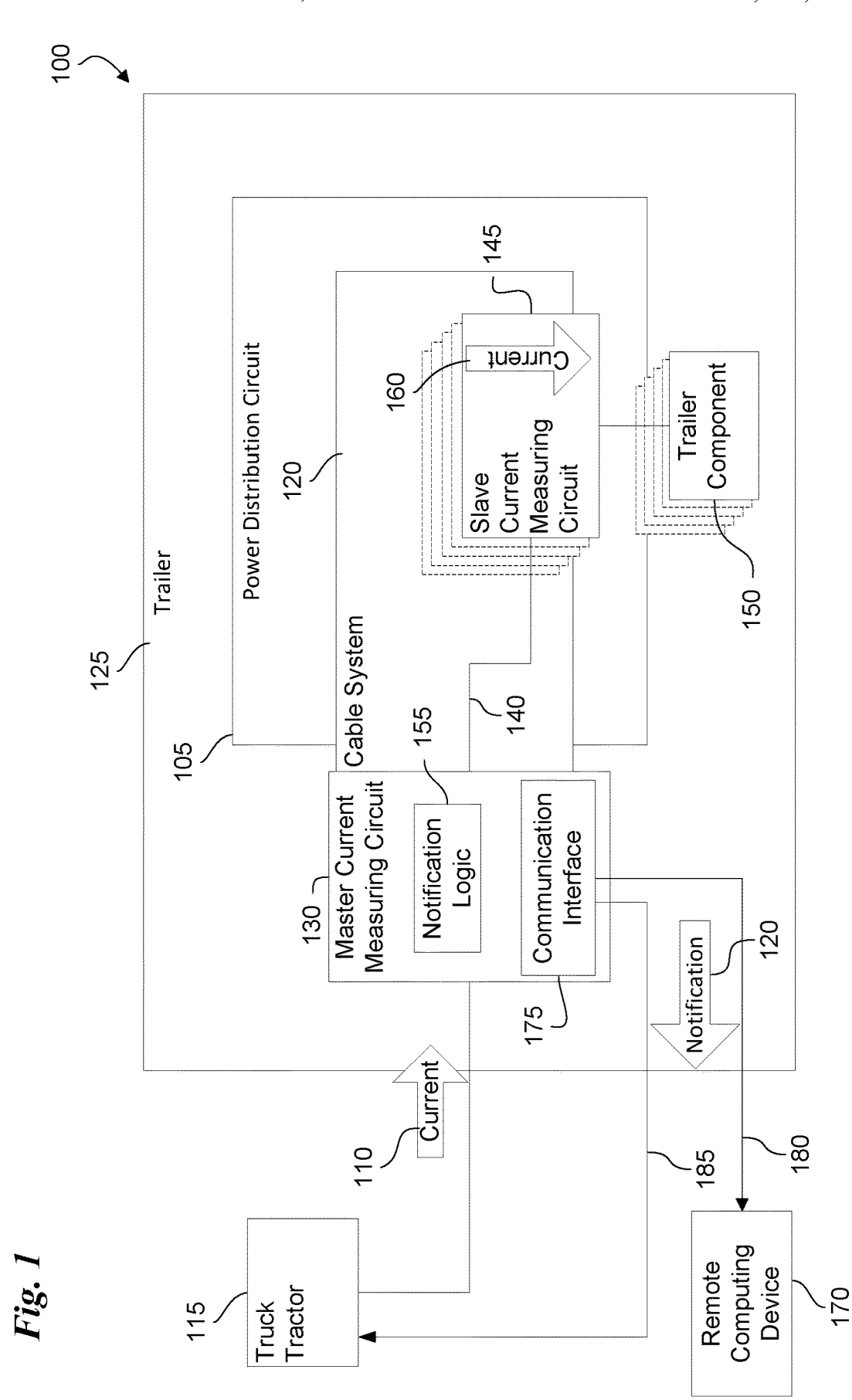
FIG. 1 is a component diagram illustrating aspects of a system for detecting anomalies in electrical wiring in a truck trailer.

FIG. 1 illustrates one example of a system for detecting circuit anomalies in a trailer 100. In this example, the system includes a master current measuring circuit 130 configured to measure a current 110 that may be received from a truck tractor 115. The master current measuring circuit 130 is optionally electrically connected upstream from a power distribution circuit 105 of trailer 125. Also included are one or more slave current measuring circuits 145 electrically connected to the power distribution circuit 105 downstream from the master current measuring circuit 130 and upstream from trailer components 150.

The trailer components 150 may be electrically connected to the power distribution circuit 105, and are optionally linked to the master current measuring circuit 130 via an internal communications link 140. The slave current measuring circuits 145 may also be electrically connected to individual trailer components 150, for example, with each of the slave current measuring circuits 145 electrically connected to individual trailer components 150.

The trailer components 150 may also be configured to measure a slave current 160 indicating current passing through the slave current measuring circuits 145. The master current measuring circuit 130 is optionally configured to command the one or more slave current measuring circuits 145 to separately measure slave current 160 and current 110. The master current measuring circuit may generate a notification 120 indicating a circuit anomaly is present when notification logic 155 determines that a difference between the master current and the slave current of one or more individual slave current measuring circuits 145 is greater than a predetermined threshold value.

In another aspect, the slave current measuring circuits 145 are configured to selectively disconnect power to one or more trailer components 150 electrically connected to the power distribution circuit 105 downstream from the slave current measuring circuits 145. In another aspect, the master current measuring circuit 130 is configured to measure the current 110 when power is disconnected from the one or more trailer components 150 to establish a baseline leakage current for the power distribution circuit 105.

In another aspect, the master current measuring circuit 130 optionally includes a communication interface 175 configured to establish at least one external communication link 180 with a remote computing device 170, and optionally a second communication link 185 with truck tractor 115, or any combination thereof. The communication interface 175 may be configured to use the external communication links 180 and 185 to send a notification 120 to the remote computing device 170 and/or truck tractor 115. In another aspect, the at least one external communication link 180, 185 includes at least one of the following, or any combination thereof: a Bluetooth wireless communication link that sends the notification according to the Bluetooth protocol, a LoRa communication link that sends the notification according to the LoRa protocol, a communication link that conforms to the Institute of Electrical and Electronics Engineers (IEEE) 802.15.4 specification, a communication link that conforms to any one or more of the IEEE 802.11 family of wireless protocols, and/or a cellular telephone communication link.

Figure 2:
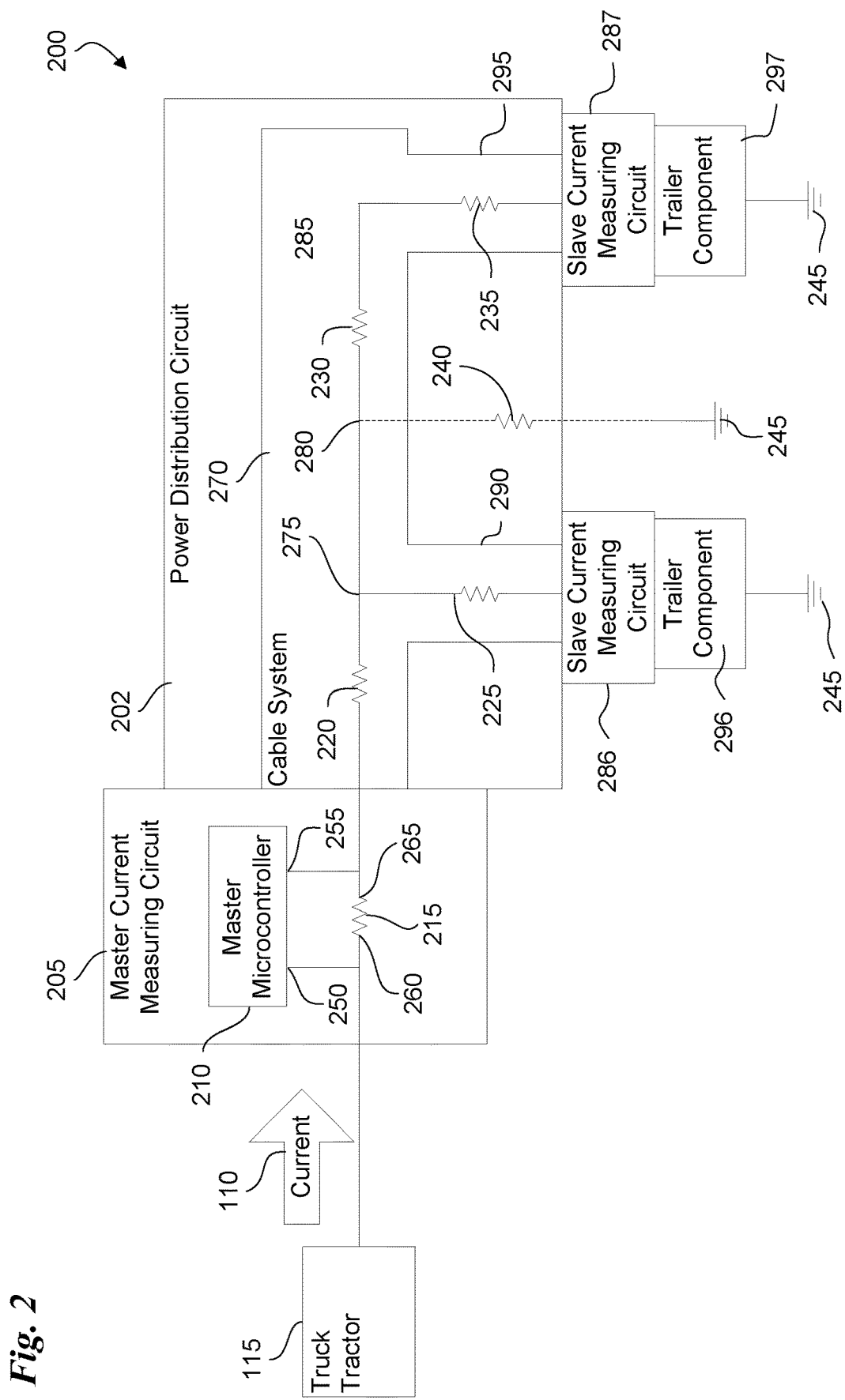
FIG. 2 is a component diagram illustrating aspects of a system for detecting anomalies in electrical wiring in a truck trailer like the one shown in FIG. 1.

In FIG. 2, a master current measuring circuit 205 is shown that is similar to the master current measuring circuit 130 of FIG. 1. The master current measuring circuit 205 includes a master shunt resistor 215 electrically connected in series upstream from a power distribution circuit 270 of power distribution circuit 105. The master current measuring circuit 205 includes a master microcontroller 210 with a first input 250 electrically connected to a first end 260 of the master shunt resistor 215, and a second input 255 electrically connected to a second end 265 of the master shunt resistor 215. In another aspect, the master microcontroller 210 is configured to measure current 110 passing through the master shunt resistor 215.

FIG. 2 also illustrates another example of a power distribution circuit 202 where a trunk resistance 220 and a trunk resistance 230 are included to illustrate on example of the resistance in cable system 270 resulting from the cables and other electrical components that may be present therein. For example, trunk resistance 220 may represent the resistance of the cable system 270 up to location 275, while trunk resistance 230 may represent the resistance of cable system 270 from location 275 to location 285. Similarly, branch 290 has a branch resistance 225 representing the resistance in the cable system 270 due to wiring and other components in that branch. The branch 295 may include a separate branch resistance 235 as well representing the resistance in the wiring for branch 295.

In another aspect, the master current measuring circuit 205 can determine the value (in Ohms) for each portion of the cable system 270 including resistors 220, 230, 225, 235. This can be useful for determining a change in different levels of current flowing through different nodes or portions of the cable system 270 over time. Thus the disclosed system can detect different circuit anomalies such as corrosion and like as they appear. For example, an anomaly 240 may appear to master current measuring circuit 205 as an alternate and unintended path to ground circuit 245 in cable system 270. This may change the distribution of current throughout the different branches of the circuit resulting in erratic behavior of trailer components 150. By comparing the current drawn by different portions of the cable system 270 with current 110, master current measuring circuit 205 can determine if anomaly 240 is present, and if so, approximately where in cable system 270 it may be found.

For example, if the slave current measuring circuits are deactivated except for 297 (which is electrically connected to branch 295), then current 110 and the current flowing through 295 should be substantially equal, or the difference between them should be less than a predetermined threshold difference—if there are no circuit anomalies present. However, if such an anomaly is present (like 240), an alternate path to ground may be present causing current 110 to divide between 240 and 295 resulting in a current through slave current measuring circuit 287 and that is no longer substantially equal to 110, or a difference that is greater than the predetermined threshold.

In another example, a similar process may be executed by master current measuring circuit 205 using slave current measuring circuit 286 and branch 290. This may be performed before or after performing the process for slave current measuring circuit 287 and branch 295 discussed above. By comparing the differences between the current 110 and the respective branch currents for 290 and 295, and by comparing these recent difference measurements with past measurements for branch 290 and 295 stored in a memory of the master current measuring circuit 205, the master current measuring circuit may optionally be able to determine that the circuit anomaly is between location 275 and 285 in the power distribution circuit 202. This location information, and/or the timing of when the anomaly 240 appeared, as well as other relevant information, may be included in the notification 120.

Figure 3:
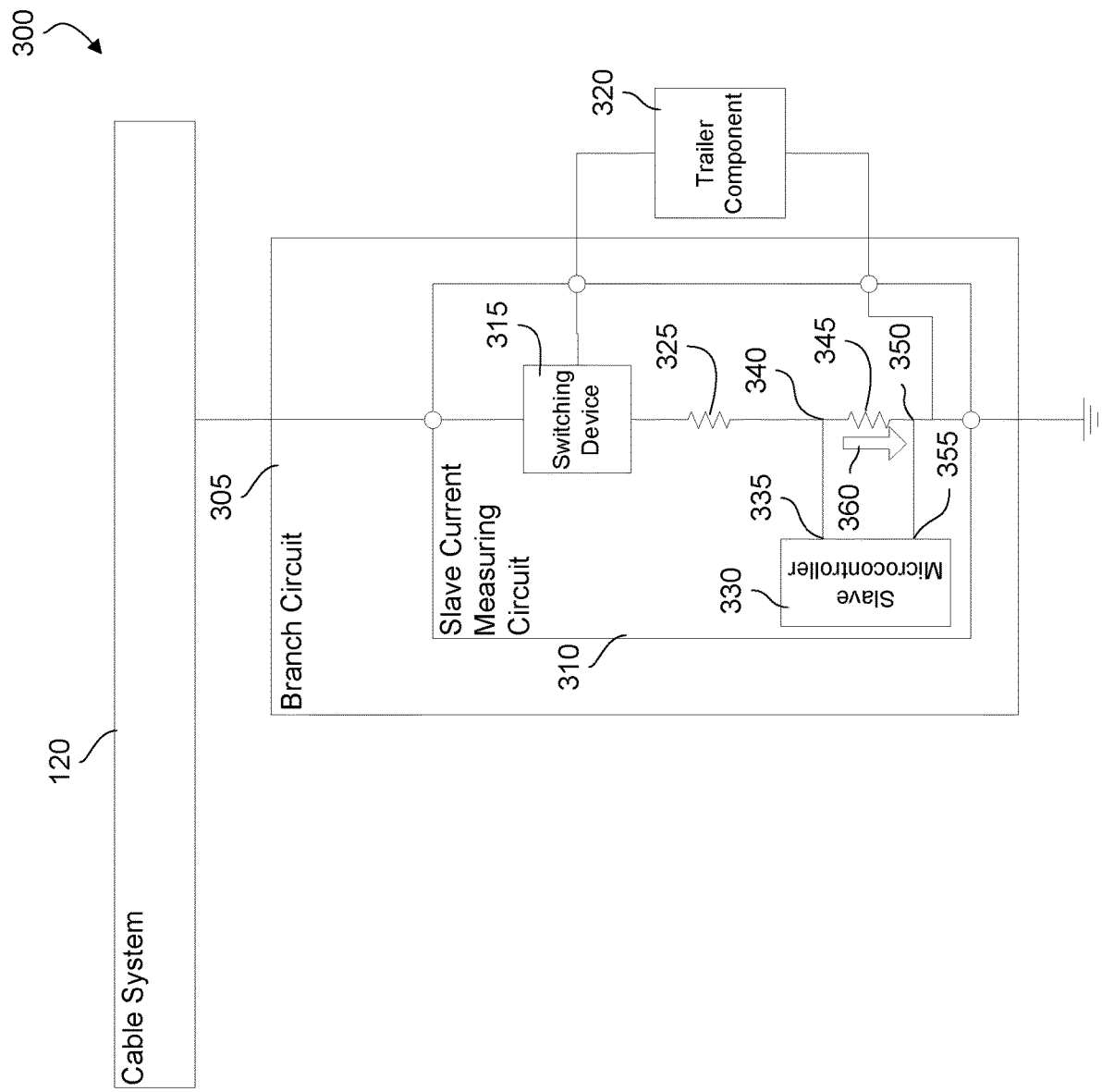
FIG. 3 is a component diagram illustrating aspects of a system for detecting anomalies in electrical wiring in a truck trailer like the one shown in the preceding figures.

In FIG. 3, a system for detecting circuit anomalies in a trailer 300 is shown that is like the one shown in FIGS. 1 and 2. In FIG. 3, a branch 305 is shown that is similar to branch 290 of FIG. 2. Branch 305 includes a slave current measuring circuit 310 that optionally includes a switching device 315 configured to selectively divert power from an individual trailer component 320 to a test load 325. In another aspect, a test shunt resistor 345 is optionally electrically connected in series downstream from the test load 325. In another aspect, a slave microcontroller 330 with a first input 335 is electrically connected to a first end 340 of the test shunt resistor 345, and a second input 355 is electrically connected to a second end 350 of the test shunt resistor 345. In another aspect, the slave microcontroller 330 is configured to measure current 360 passing through the test shunt resistor 345.

In another aspect, the test load 325 includes a resistance equivalent to an overall resistance of the trailer component 320 electrically connected to the cable system 165 downstream from the slave current measuring circuit 310. In another aspect, trailer component 320 optionally includes at least one LED lamp electrically connected to the individual branch, and wherein the switching device is controlled by the slave microcontroller to selectively divert power from the at least one LED lamp to the test load. Trailer component 320 may be any trailer component such as an Anti-lock Brake System (ABS) controller, a back-up camera, a temperature sensor, or fuel level sensor, to name a few non-limiting examples.

Figure 4:
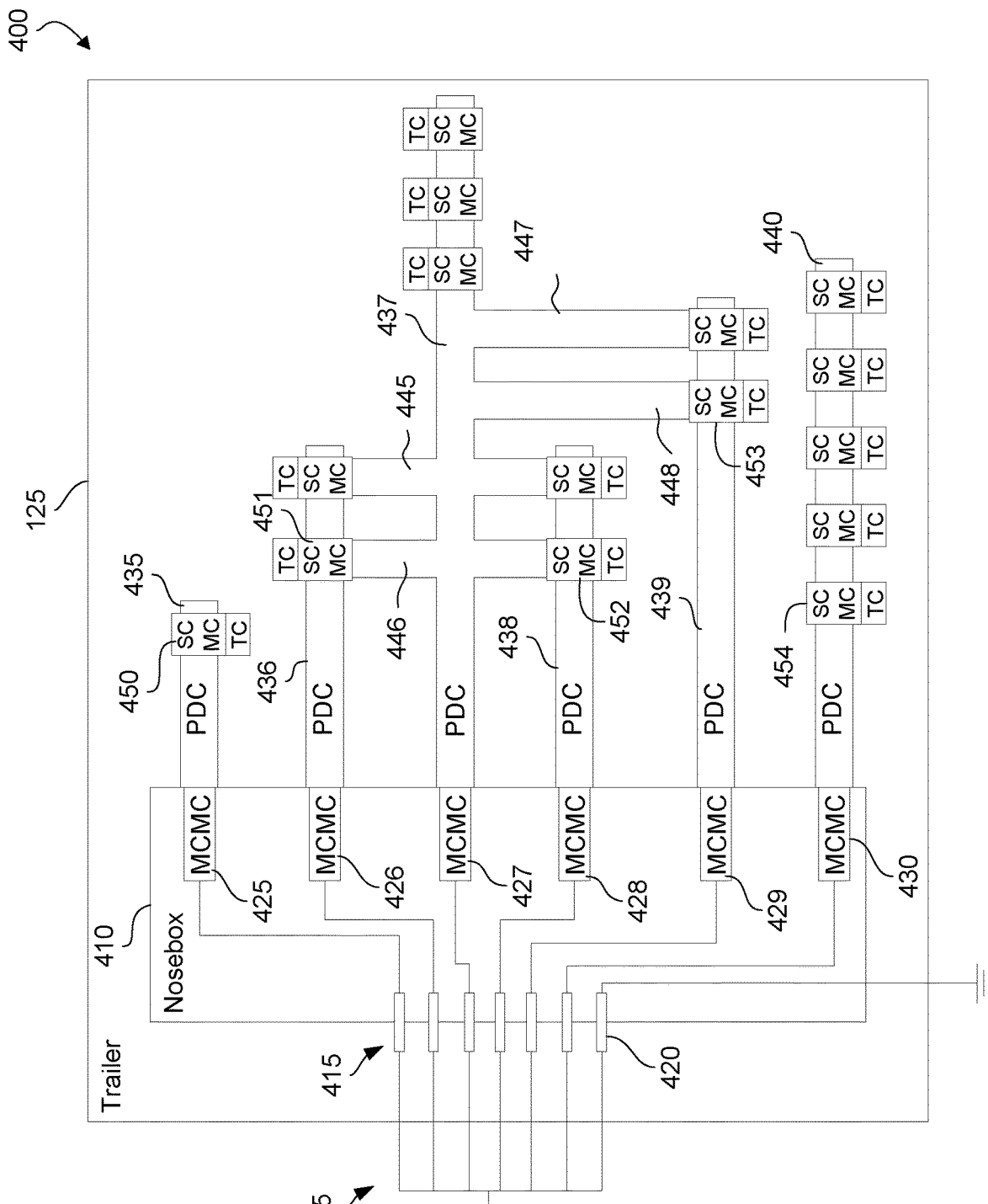
FIG. 4 is a component diagram illustrating aspects of a system for detecting anomalies in electrical wiring in a truck trailer like the one shown in the preceding figures.

FIG. 4 illustrates at 400 another example of a system for detecting circuit anomalies in a trailer that is like the ones shown in the preceding figures. Included in trailer 125 is a nose box 410 that includes six terminals 415 for accepting tractor power cables 405 from truck tractor 115. A single ground terminal 420 may be included as well, and terminals 415 and ground terminal 420 may be electrically connected to truck tractor 115 by tractor cables 405.

The nose box 410 may include six different master current measuring circuits 425-430. Each of the six master current measuring circuits may be individually electrically connected to one of six separate power distribution circuits 435-440. The six separate power distribution circuits may be separately electrically connected to multiple slave current measuring circuits such as circuits 450-454. Any suitable number of slave current measuring circuits may be included to support any suitable number of trailer components 150. The power distribution circuits may be organized in any suitable fashion in trailer 125 and in some examples, multiple power distribution circuits may be separately electrically connected to an individual slave current measuring circuit. Slave current measuring circuits may be individually electrically connected to trailer components such as, for example, LED lamps.

For example, the slave current measuring circuit 451 may be electrically connected to one of two right turn indicators, and it may also be electrically connected to and receive from power distribution circuit 436. The power distribution circuit 437 may also be electrically connected to slave current measuring circuit 451 via a branch 446. In this way, trailer 125 may configure a trailer component such as a lamp with electrical connections to slave current measuring circuit 451 to operate in multiple modes, such as either a right turn signal, or a running lamp.

In another example, power distribution circuit 439 may be configured to provide power to trailer components such as LED lamps operating as a rear stop lamp. In this configuration, the LED lamp electrically connected to slave current measuring circuit 453 may be electrically connected to power distribution circuit 437 as well via branch circuit 448 so that the lamp at slave current measuring circuit 453 may be operable as a brake lamp or a running lamp. Thus trailer components electrically connected to slave circuit measuring circuits that receive power from more than one power distribution circuit may be useful for detecting circuit anomalies in more than one circuit.

In another example, a power distribution circuit 435 may be electrically connected to a single slave current measuring circuit 450, such as in the case of a slave current measuring circuit 450 electrically connected to an ABS controller. In yet another example, a power distribution circuit 440 may include multiple trailer components coupled to multiple slave current measuring circuits like slave current measuring circuit 454.

Figure 5:
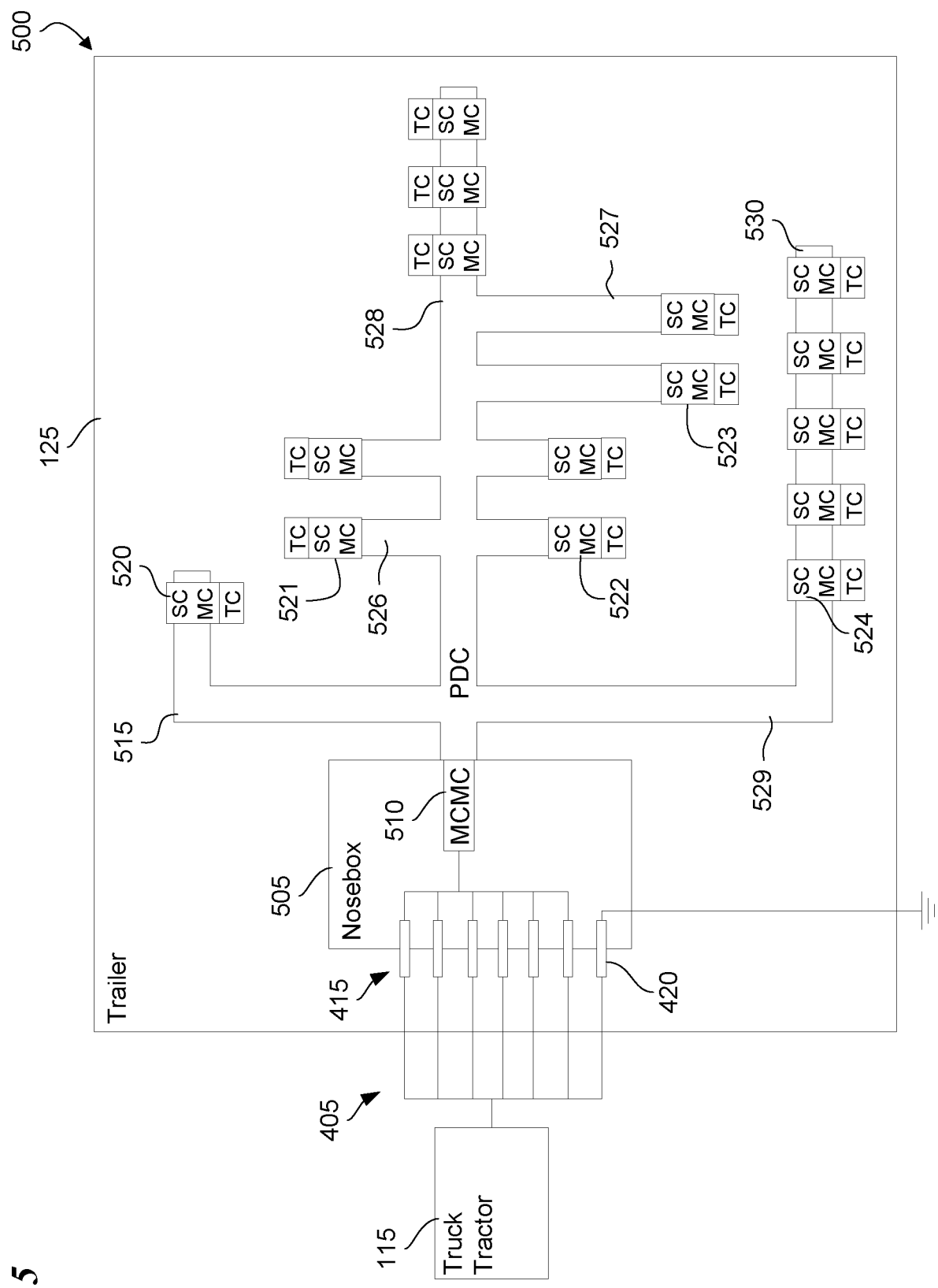
FIG. 5 is a component diagram illustrating another example of aspects of a system for detecting anomalies in electrical wiring in a truck trailer like the one shown in FIG. 4.

FIG. 5 illustrates another example of a system for detecting circuit anomalies in a trailer 500 that is like the ones shown in the preceding figures. Included in trailer 125 is a nose box 505 that includes six terminals 415 for accepting tractor power cables 405 from truck tractor 115. A single ground terminal 420 may be included as well, and terminals 415 and ground terminal 420 may be electrically connected to truck tractor 115 by tractor power cables 405

The nose box 505 may include a master current measuring circuit 510 electrically connected to a power distribution circuit 515. Multiple slave current measuring circuits 520-524, and others, may be connected to branches of power distribution circuit 515 such as branches 526-530. A branch such as branch 528 may be separately electrically connected to multiple slave current measuring circuits. Any suitable number of slave current measuring circuits may be included to support any suitable number of trailer components 150. The slave current measuring circuits may be individually electrically connected to trailer components such as, for example, LED lamps, backup-up cameras, and the like. In another aspect, the master current measuring circuit 510 may selectively provide electrical power to power distribution circuit 515. This power may be received from one or more of the six terminals 415.

For example, the slave current measuring circuit 521 may be electrically connected to one of two right turn indicators, and the slave current measuring circuit 521 may receive power and/or communications from branch 528 via branch 526. In this way, a single branch 528 may be arranged and configured to deliver power to trailer components such as LED lamps via a single power and/or communication connection that allows the lamp to function as either a right turn signal, or a running lamp.

In another example, branch 528 may also be configured to provide power to slave current measuring circuit 523 electrically connected to a trailer component such as an LED lamp operating as a rear stop lamp or as a rear tail lamp. In this configuration, the LED lamp electrically connected to slave current measuring circuit 523 is electrically connected to other trailer components by branch 528, but can be controlled by master current measuring circuit 510 to test for anomalies. Thus trailer components electrically connected to slave current measuring circuits that receive power from a single power distribution circuit may be useful for detecting circuit anomalies in more than one portion of the circuit.

In another example, a branch 528 may be electrically connected to a single slave current measuring circuit 520, such as in the case of a slave current measuring circuit 520 electrically connected to an ABS controller. In yet another example, a branch 530 may be electrically connected to multiple trailer components coupled to multiple slave current measuring circuits like slave current measuring circuit 524, such as in the case of a branch 529 feeding power and communications to a group of clearance lamps on the trailer 125.

Figure 6:
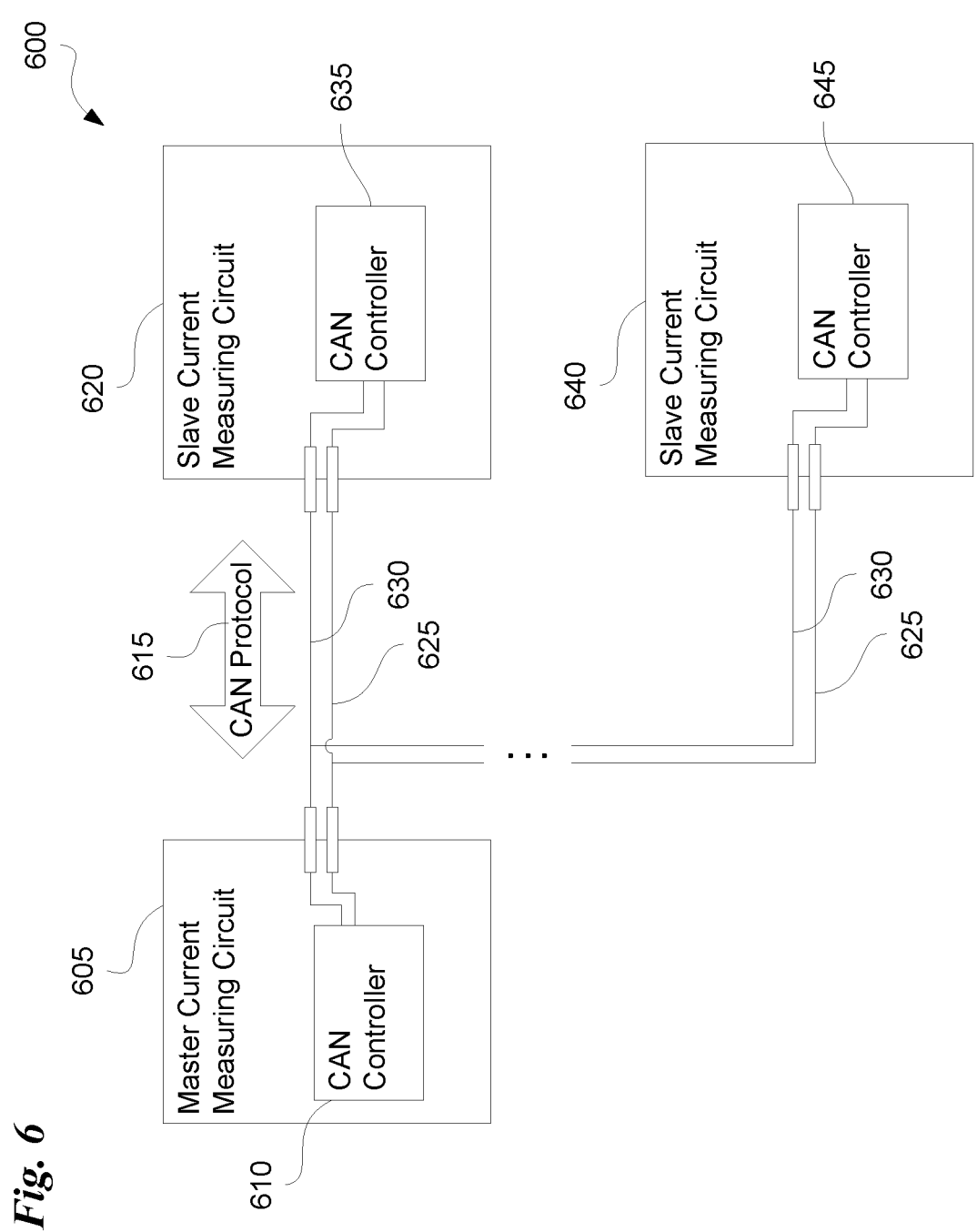
FIG. 6 is a component diagram illustrating aspects of a system for detecting anomalies in electrical wiring in a truck trailer like the one shown in the preceding figures.

FIG. 6 illustrates another example of a system for detecting circuit anomalies in a trailer 600 like those shown in the preceding figures. In FIG. 6, the internal communications link 140 is illustrated as a Control Area Network (CAN). A master current measuring circuit 605 includes a CAN controller 610 that is electrically connected to one or more CAN controllers 635, 640 and possibly others, in one or more slave current measuring circuits such as 620 and 640. The CAN low communication cable 625 and a CAN high communication cable 630 provide two communication cables electrically connecting the master current measuring circuit 605 and the slave current measuring circuit 620 and 640. The CAN controller 610 is electrically connected to the communication cables 625 and 630. In another aspect, the slave current measuring circuit 620 and 640 optionally include a CAN controller 635 and 645 electrically connected to the two communication cables. In this configuration, the mater and slave current measuring circuits communicate using the CAN protocol 615.

Figure 7:
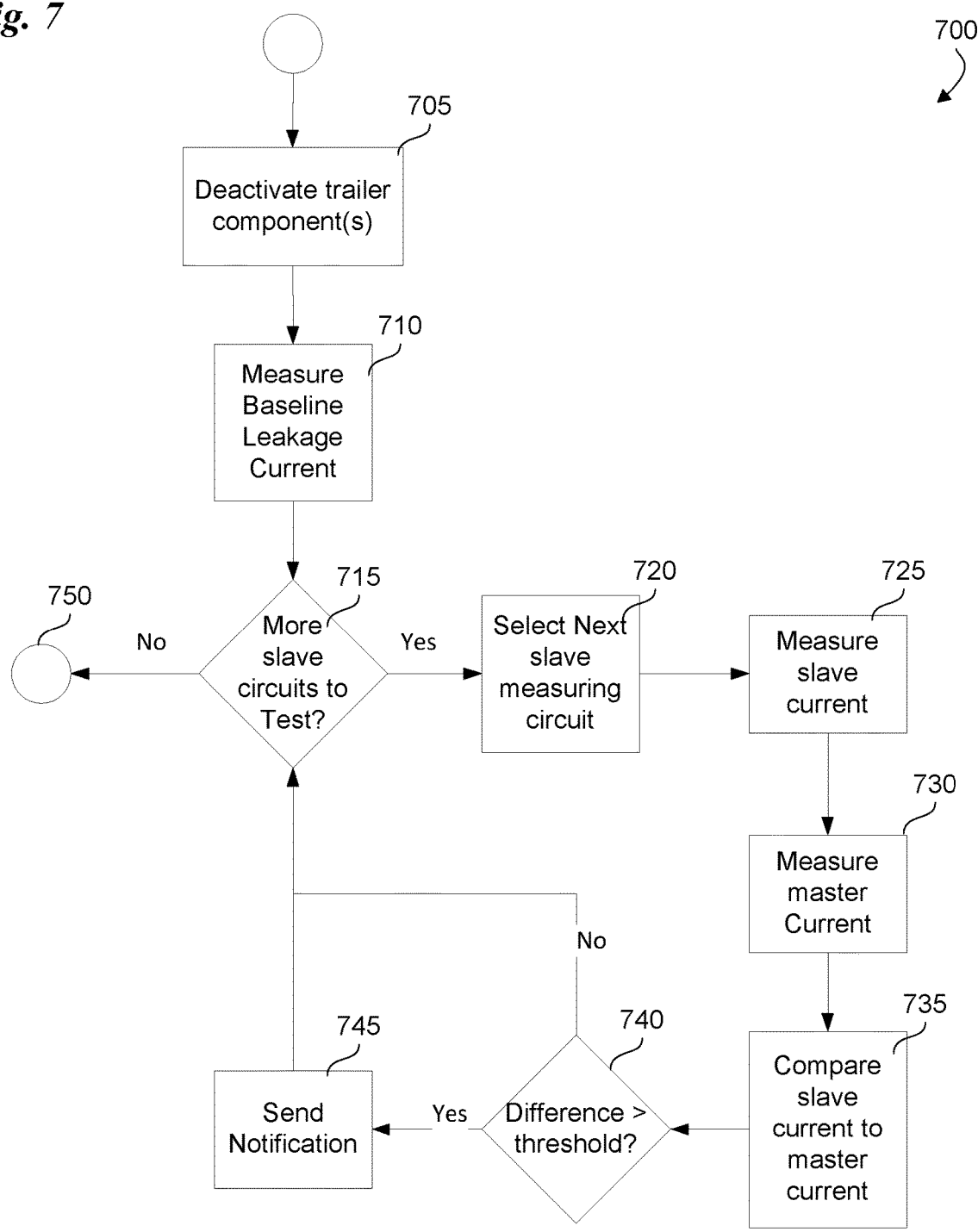
FIG. 7 is a flowchart illustrating operational aspects of a system for detecting anomalies in electrical wiring in a truck trailer like the one shown in the preceding figures.

One example of actions that may be taken by the disclosed system for detecting anomalies in electrical wiring for a truck trailer is illustrated at 700 in FIG. 7. In discussing the concepts illustrated in FIG. 7, generic references to aspects of the system disclosed herein elsewhere such as "trailer components", "power distribution circuits", and the like, shall be understood to refer to any of the disclosed examples mentioned herein, or any suitable substitutes that are within the scope of the disclosed concepts, and are not exclusive or limited to any one example unless so indicated.

At 705, the system may deactivate one or more trailer components that are electrically connected to a power distribution circuit in a truck trailer. In another aspect, the trailer components may be controlled by slave current measuring circuits like circuits, these circuits being responsive to a master current measuring circuit. The master current measuring circuit may communicate with the slave current measuring circuits using an internal communication link which may be implemented using any suitable wired or wireless technology.

In another aspect, the action of deactivating one or more trailer components may involve optionally diverting power from the one or more trailer components using a switching device like switching device 315, that is configured to selectively divert power from the one or more trailer components to a test load downstream from the switching device.

In another aspect, the internal communications link may be configured with components like those shown in FIG. 6 where the internal communication link includes communication cables electrically connecting the slave current measuring circuit to the master current measuring circuit. The master current measuring circuit may include a master CAN controller electrically connected to the communication cables. The slave current measuring circuit may include a corresponding slave CAN controller also electrically connected to the communication cables. In this example, the master and slave current measuring circuits may thus communicate using the control area network according to the CAN protocol.

In another aspect, the internal communications link may be configured with components like those shown in FIG. 6 where the internal communication link includes a single communication cable electrically connecting the slave current measuring circuit to the master current measuring circuit. For example, the master current measuring circuit may include a master Local Interconnect Network (LIN) controller electrically connected to the communication cable. The slave current measuring circuit may include a corresponding slave LIN controller also electrically connected to the communication cable. In this example, the master and slave current measuring circuits may thus communicate using the local interconnect network according to the LIN protocol.

In another aspect, the one or more slave current measuring circuits may measure one or more slave current values at 725 indicating current passing through the power distribution circuit at the one or more slave current measuring circuits.

In another aspect, measuring the slave current values may include measuring the current passing through a slave shunt resistor using a circuit similar to what is shown in FIG. 3. A slave shunt resistor like test shunt resistor 345 may be connected in series downstream from the test load 325. The current passing through the slave shunt resistor may be measured using a slave microcontroller like slave microcontroller 330 with a first input 335 electrically connected to the first end 340 of the slave shunt resistor, and second input 355 electrically connected to a second end 350 of the slave shunt resistor. In another aspect, the master current measuring circuit may be used to measure a master current at 730 indicating the current passing into the power distribution circuit from the truck tractor or other such circuit.

In another aspect, the master current measuring circuit may be configured as shown in FIG. 2 operable to measure the current passing through a master shunt resistor 215 connected in series upstream from the power distribution circuit. This current passing through the master shunt resistor 215 may be measured using a master microcontroller like master microcontroller 210 with a first input 250 electrically connected to a first end 260 of the master shunt resistor 215, and a second input 255 electrically connected to a second end 265 of the master shunt resistor 215.

In another aspect, the system may be optionally configured to determine a baseline leakage current at 710. This baseline leakage current may be used to adjust the predetermined threshold value that is used to determine the presence of anomalies. Any suitable technique for determining leakage current may be used. In one example, the master current measuring circuit may notify the slave current measuring circuits to deactivate all of the trailer components before measuring the master current to determine the baseline leakage current. This baseline leakage current may be saved by the master current measuring circuit to be used in the future in determining the presence of circuit anomalies. In another aspect, the baseline leakage current may be saved each time the master current measuring circuit is activated, and these values may be reported and tracked over time to assess deterioration in the power distribution circuitry.

In another aspect, the master current measuring circuit may compare slave current values to the master current at 735, and may generate a notification of a circuit anomaly at 745 when the difference between at least one of the slave current values and the master current value is greater than a predetermined threshold value as shown at 740.

In another aspect, the system may establish at least one external communication link with a remote computing device using a communications circuit. In one example, the master current measuring circuit may control the communication circuit to establish the link using transmitters, receivers, antennas, and the like included in the master current measuring circuit. These components of the communication circuit may implement communications with the remote computing device by any suitable means or protocols, such as by communicating using Wi-Fi, Bluetooth, a USB cable, and the like. Thus the communications circuit may be configured to use the external communication link to send the circuit anomaly notifications to the remote device.

In another aspect, the system may determine which slave current measuring circuits to include in diagnosing any circuit anomalies and may then perform the above disclosed actions for each of the one or more trailer components electrically connected to the power distribution circuit. Determining which circuits to test, how often to test them, and under what circumstances a particular portion of the power distribution circuit should be tested, may be configured as operating parameters in the master current measuring circuit. These parameters may be adjusted either manually or automatically. For example, the master current measuring circuit may be programmed to test for circuit anomalies more often as the trailer wiring ages. In another example, the master current measuring circuit may be programmed to reduce the number of tests for a given portion of the power distribution circuit when the operating parameters are updated to reflect that a particular portion of the power distribution circuit has been replaced or serviced recently.

Thus all power distribution circuits deemed relevant to include in such a test may be examined for circuit anomalies. This examination process may take place at predetermined times, such as when power is initially introduced from the truck to the trailer, when the trailer comes to a stop, when the truck parking brake is activated, or at predetermined intervals while the truck and trailer are in operation such as more than once a day, more than twice a day, more than once an hour, more than once every half hour, and the like.

For example, the time necessary to deactivate and test a circuit for a particular portion of the power distribution circuit may be less than five seconds, less than one second, less than $1/10$ of a second, or less than a thousandth of a second to give a few nonlimiting examples. The corresponding time to measure every relevant branch or portion of the power distribution circuit may be less than five seconds, less than one second, less than one hundredth of a second, and the like. Thus testing for circuit anomalies in a truck trailer may occur without impairing the performance of the trailer or the truck before, during, or after the truck and trailer are in motion.

Figure 8:
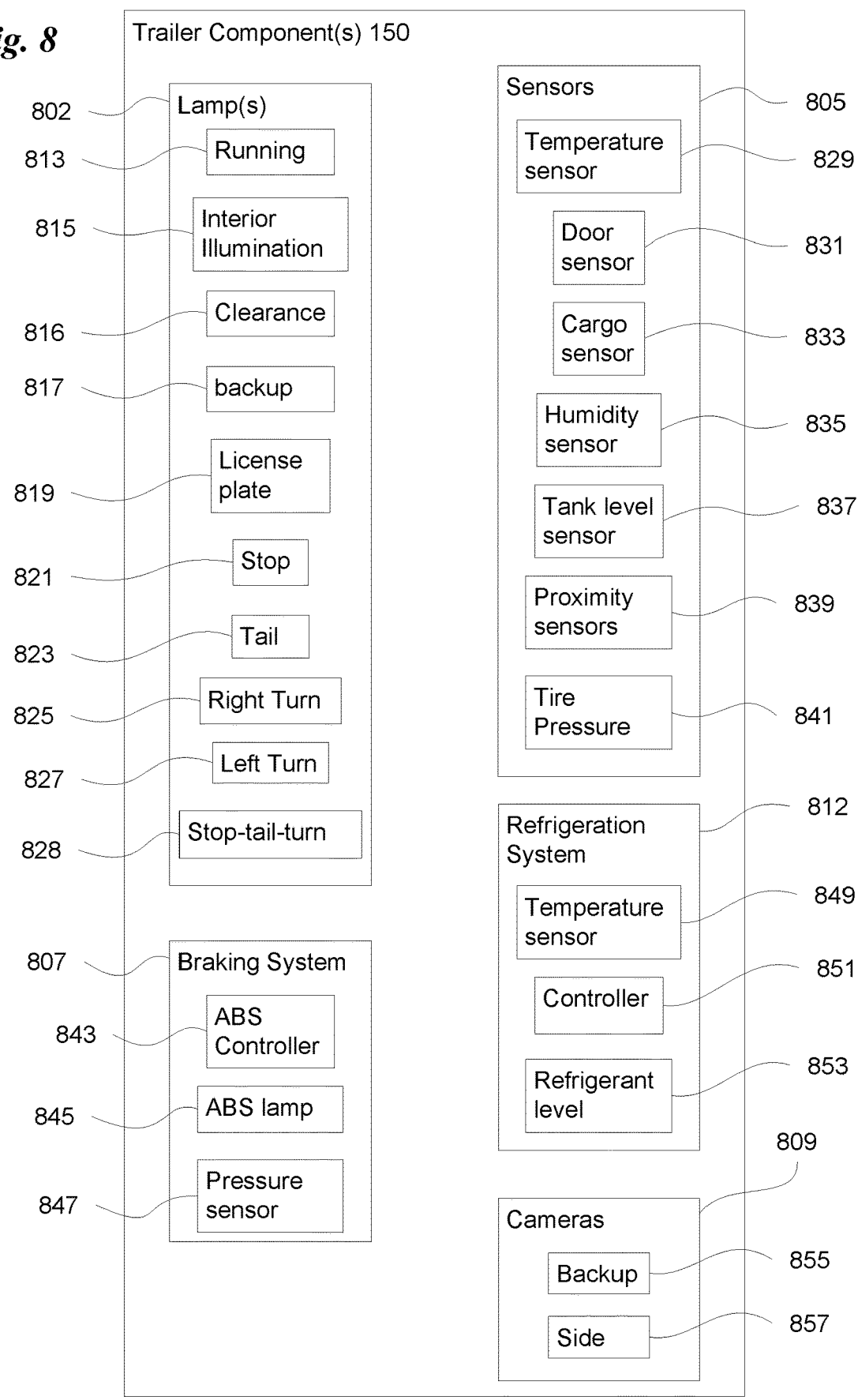
FIG. 8 is a component diagram illustrating examples of trailer components that may be used in the system of the preceding figures.

Examples of trailer components 800 that may be electrically connected to cable systems like those discussed herein elsewhere are shown in FIG. 8. The trailer components 150 shown in FIG. 8 are merely examples of components that might be included in a trailer 125, and should not be construed as an exhaustive list or as otherwise limiting the types of components envisioned. Other components may be included while some listed here may be excluded depending on the type of trailer and other factors.

The trailer components 800 may include lamp(s) 802, braking system 807, sensors 805, cameras 809, and/or refrigeration system 812. For example, lamp(s) 802 may include, but are not limited to, running lamps 813, interior illumination lamps 815 for lighting the interior of the trailer, side marking/clearance/identification lamps 816 for marking extremities of the trailer, backup lamps 817 for illuminating the area behind the trailer, license plate lamp(s) 819 for lighting license plates and other identifying indicia mounted on the trailer, stop lamps 821 that may illuminate when the vehicle is actively braking, tail lamps 823, left turn lamps 827 and right turn lamps 825, and, stop-tail-turn 828.

The sensors 805 may include any of temperature sensor 829 for sensing the temperature in and/or around trailer 125, door sensor 831 configured to optionally sense when trailer doors are open or closed, cargo sensor 833 configured to optionally sense weight, location, and/or other attributes of cargo in or on trailer 125, humidity sensor 835 for optionally sensing absolute or relative humidity in and/or around trailer 103, tank level sensor 837 optionally for sensing the level of fluids (liquids or gases) carried by trailer 125, proximity sensor 839 optionally for sensing proximity of trailer 125 relative to nearby objects, and/or tire pressure sensor 841 optionally for sensing pressure levels in tires of trailer 125.

The braking system 807 may optionally include an anti-lock Brakes (ABS) controller 843 for controlling the ABS braking system, ABS lamp 845 optionally for indicating the status or failure of the braking system 807, and/or pressure sensor 847 optionally included to sense changes in hydraulic or air pressure in braking system 807. Other optional trailer components include cameras 809 such as one or more backup cameras 855 for optionally capturing a view of the surrounding area directly behind trailer 125, and one or more side cameras 857 for optionally capturing a view of areas adjacent the sides of trailer 125.

Components of refrigeration system 812 may include temperature sensor 849 for determining the temperature inside the refrigerated cargo area of the trailer, controller 851 configured to control the refrigeration cycle in the refrigeration system, and refrigerant level sensor 853 for determining the level of refrigerant in refrigeration system 812.

Other examples of the disclosed concepts include the following numbered examples:

Example 1

A system for detecting anomalies in electrical wiring in a truck trailer, having:
a master current measuring circuit configured to measure a master current indicating current received from a truck tractor, the master current measuring circuit electrically connected upstream from a power distribution circuit of the trailer;
one or more slave current measuring circuits electrically connected to the power distribution circuit downstream from the master current measuring circuit and upstream from one or more trailer components electrically connected to the power distribution circuit, wherein the slave current measuring circuits are:
  a) linked to the master current measuring circuit via an internal communications link;
  b) electrically connected to individual trailer components of the one or more trailer components; and
  c) configured to measure a slave current indicating current passing through the slave current measuring circuit;
wherein the master current measuring circuit is configured to:
  command the one or more slave current measuring circuits to separately measure the slave current;
  measure the master current; and
  generate a notification of a circuit anomaly when a difference between the master current level and the slave current of one or more individual slaves is greater than a predetermined threshold value.

Example 2

The system of example 1, wherein the master current measuring circuit comprises:
a master shunt resistor electrically connected in series upstream from the power distribution circuit; and
a master microcontroller with a first input electrically connected to a first end of the master shunt resistor, and a second input electrically connected to a second end of the master shunt resistor;
wherein the master microcontroller is configured to measure current passing through the master shunt resistor.

Example 3

The system of any preceding example, wherein the one or more slave current measuring circuits comprises:
a switching device configured to selectively divert power from an individual branch of the power distribution circuit to a test load;
a slave shunt resistor electrically connected in series downstream from the test load; and
a slave microcontroller with a first input electrically connected to a first end of the slave shunt resistor, and a second input electrically connected to a second end of the slave shunt resistor; and
wherein the slave microcontroller is configured to measure current passing through the slave shunt resistor.

Example 4

The system of any preceding example, wherein the test load includes a resistance equivalent to an overall resistance of the one or more trailer components electrically connected to the power distributions circuit downstream from the slave current measuring circuit.

Example 5

The system of any preceding example, wherein the slave current measuring circuits are configured to selectively disconnect power to one or more trailer components electrically connected to the power distributions circuit downstream from the slave current measuring circuit; and
wherein the master current measuring circuit is configured to measure the master current when power is disconnected from the one or more trailer components to establish a baseline leakage current for the power distribution circuit.

Example 6

The system of any preceding example having:
a nosebox mounted to the truck trailer, the nosebox having terminals for connecting six separate power cables and a ground cable to a truck tractor;
wherein the system includes six separate master current measuring circuits electrically connected to the six separate power cables and to six separate power distribution circuits which are included in the trailer, the six separate distribution circuits having separate one or more slave current measuring circuits.

Example 7

The system of any preceding example having:
a nosebox mounted to the trailer, the nosebox having terminals for connecting six separate power cables and a ground cable to a truck tractor;
wherein the master current measuring circuit provides power from one or more of the six separate power cables to a single power distribution circuit electrically connected to the one or more trailer components.

Example 8

The system of any preceding example wherein the internal communications link comprises:

two communication cables electrically connected to the master current measuring circuit;
wherein the master current measuring circuit includes a master Control Area Network (CAN) controller electrically connected to the communication cables;
wherein the slave current measuring circuit includes a slave CAN controller electrically connected to the two communication cables; and
wherein the master and slave current measuring circuits communicate using a CAN protocol.

Example 9

The system of any preceding example, wherein the master current measuring circuit comprises:
a communication circuit configured to establish at least one external communication link with a remote computing device;
wherein the communication circuit is configured to use the external communication link to send the notification to the remote computing device.

Example 10

The system of any preceding example, wherein the at least one external communication link includes at least one of the following, or any combination thereof:
a Bluetooth wireless communication link that sends the notification according to the Bluetooth protocol,
a LoRa communication link that sends the notification according to the LoRa protocol,
a communication link that conforms to the Institute of Electrical and Electronics Engineers (IEEE) 802.15.4 specification,
a communication link that conforms to any one or more of the IEEE 802.11 family of wireless protocols, and/or
a cellular telephone communication link.

Example 11

The system of any preceding example, wherein one or more trailer components includes at least one LED lamp electrically connected to the individual branch, and wherein the switching device is controlled by the slave microcontroller to selectively divert power from the at least one LED lamp to the test load.

Example 12

A method of detecting anomalies in electrical wiring in a truck trailer that includes:
deactivating one or more trailer components electrically connected to a power distribution circuit in a truck trailer, wherein the one or more trailer components are controlled by one or more slave current measuring circuits, and wherein the slave current measuring circuits are responsive to a master current measuring circuit via an internal communications link;
using the one or more slave current measuring circuit to measure one or more slave current values indicating current passing through the power distribution circuit at the one or more slave current measuring circuits;
measuring a master current indicating the current passing into the power distribution circuit using a master current measuring circuit;
comparing the one or more slave current values to the master current using the master current measuring circuit; and
generating a circuit anomaly notification when a difference between at least one of the slave current values and the master current is greater than a predetermined threshold value.

Example 13

The method of example 12, including deactivating all of the one or more trailer components using the master current measuring circuit controlling the slave current measuring circuits; and
measuring the master current using the master current measuring circuit and saving the master current as a baseline leakage current in a memory of the master current measuring circuit.

Example 14

The method of any one of examples 12-13, wherein the predetermined threshold value is determined based on the baseline leakage current.

Example 15

The method of any one of examples 12-15, wherein measuring the master current comprises:
measuring current passing through a master shunt resistor connected in in series upstream from the power distribution circuit, wherein the current passing through the master shunt resistor is measured using a master microcontroller with a first input electrically connected to a first end of the master shunt resistor, and a second input electrically connected to a second end of the master shunt resistor.

Example 16

The method of any one of examples 12-16, wherein the action of deactivating one or more trailer components includes:
diverting power from the one or more trailer components using a switching device configured to selectively divert power from the one or more trailer components to a test load downstream from the switching device.

Example 17

The method of any one of examples 12-16, wherein measuring the slave current includes: measuring current passing through a slave shunt resistor connected in series downstream from the test load, wherein the current passing through the slave shunt resistor is measured using a slave microcontroller with a first input electrically connected to a first end of the slave shunt resistor, and a second input electrically connected to a second end of the slave shunt resistor.

Example 18

The method of any one of examples 12-17, including performing the actions specified in claim 12 for each of the one or more trailer components electrically connected to the power distribution circuit.

Example 19

The method of any one of examples 12-18 wherein the internal communications link comprises:
two communication cables electrically connected to the master current measuring circuit;
wherein the master current measuring circuit includes a master Control Area Network (CAN) controller electrically connected to the communication cables;
wherein the slave current measuring circuit includes a slave CAN controller electrically connected to the two communication cables; and
wherein the master controls the slave current measuring circuits using a CAN protocol.

Example 20

The method of any one of examples 12-19, including:
establishing at least one external communication link with a remote device using a communications circuit responsive to the master current measuring circuit;
wherein the communications circuit is configured to use the external communication link to send the circuit anomaly notifications to the remote device.

Example 21

The method of any one of examples 12-20, wherein the one or more trailer components include vehicle stop-tail-turn lamps, vehicle turn signal lamps, vehicle brake lamps, vehicle tail lamps, vehicle running lamps, vehicle anti-lock brakes, vehicle interior illumination lamps, vehicle reverse lamps, or any combination thereof.

Example 22

The method of any one of examples 12-21, wherein the one or more trailer components include an antilock brake system controller, pressure sensors, temperature sensors, door sensors, cargo sensors, cargo length sensors, liquid level sensors, refrigeration sensors, or any combination thereof.

Glossary of Definitions and Alternatives

While examples of the inventions are illustrated in the drawings and described herein, this disclosure is to be considered as illustrative and not restrictive in character. The present disclosure is exemplary in nature and all changes, equivalents, and modifications that come within the spirit of the invention are included. The detailed description is included herein to discuss aspects of the examples illustrated in the drawings for the purpose of promoting an understanding of the principles of the inventions. No limitation of the scope of the inventions is thereby intended. Any alterations and further modifications in the described examples, and any further applications of the principles described herein are contemplated as would normally occur to one skilled in the art to which the inventions relate. Some examples are disclosed in detail, however some features that may not be relevant may have been left out for the sake of clarity.

Where there are references to publications, patents, and patent applications cited herein, they are understood to be incorporated by reference as if each individual publication, patent, or patent application were specifically and individually indicated to be incorporated by reference and set forth in its entirety herein.

Singular forms "a", "an", "the", and the like include plural referents unless expressly discussed otherwise. As an illustration, references to "a device" or "the device" include one or more of such devices and equivalents thereof.

Directional terms, such as "up", "down", "top" "bottom", "fore", "aft", "lateral", "longitudinal", "radial", "circumferential", etc., are used herein solely for the convenience of the reader in order to aid in the reader's understanding of the illustrated examples. The use of these directional terms does not in any manner limit the described, illustrated, and/or claimed features to a specific direction and/or orientation.

Multiple related items illustrated in the drawings with the same part number which are differentiated by a letter for separate individual instances, may be referred to generally by a distinguishable portion of the full name, and/or by the number alone. For example, if multiple "laterally extending elements" 90A, 90B, 90C, and 90D are illustrated in the drawings, the disclosure may refer to these as "laterally extending elements 90A-90D," or as "laterally extending elements 90," or by a distinguishable portion of the full name such as "elements 90". The language used in the disclosure are presumed to have only their plain and ordinary meaning, except as explicitly defined below. The words used in the definitions included herein are to only have their plain and ordinary meaning. Such plain and ordinary meaning is inclusive of all consistent dictionary definitions from the most recently published Webster's and Random House dictionaries. As used herein, the following definitions apply to the following terms or to common variations thereof (e.g., singular/plural forms, past/present tenses, etc.):

"Anomaly" generally refers to a deviation from a previously imposed standard, or from what is considered normal, desirable, or expected behavior.

"Anti-lock Braking System" generally refers to a vehicle safety system that allows the wheels on a motor vehicle (including trailers) to maintain tractive contact with the road surface according to driver inputs while braking, preventing the wheels from locking up (ceasing rotation) and avoiding uncontrolled skidding. ABS systems automatically apply the principles of threshold braking and cadence braking albeit a much faster rate and with better control than drivers can typically manage manually. ABS systems include wheel speed sensors to detect reduced wheel rotation indicative of impending wheel lock. An ABS controller is also included that can automatically actuate the braking system to reduce braking force on the affected wheel or wheels, and to quickly reapply braking force when the danger of wheel lock is reduced. This overall feedback loop may be executed multiple times a second resulting in rapid activation and deactivation of braking force or "pulsing" of the brakes.

Maximum braking force is obtained with approximately 10-20% slippage between the braked wheel's rotational speed and the road surface. Beyond this point, rolling grip diminishes rapidly and sliding friction provides a greater proportion of the force that slows the vehicle. Due to local heating and melting of the tires, the sliding friction can be very low. When braking at, or beyond, the peak braking force, steering input is largely ineffective since the grip of the tire is entirely consumed in braking the vehicle.

Threshold braking seeks to obtain peak friction by maintaining the maximum braking force possible without allowing wheels to slip excessively. Braking beyond the slipping point causes tires to slide and the frictional adhesion between the tire and driving surface is thus reduced. The aim of threshold braking is to keep the amount of tire slip at the optimal amount, the value that produces the maximum frictional, and thus braking force. When wheels are slipping significantly (kinetic friction), the amount of friction available for braking is typically substantially less than when the wheels are not slipping (static friction), thereby reducing the braking force. Peak friction occurs between the static and dynamic endpoints, and this is the point that threshold braking tries to maintain.

"Cadence" braking or "stutter" braking involves pumping the brake pedal and is used to allow a car to both steer and brake on a slippery surface. ABS systems generally provide this behavior automatically and at a much higher rate than most drivers can manually produce. It is used to effect an emergency stop where traction is limited to reduce the effect of skidding from road wheels locking up under braking. This can be a particular problem when different tires have different traction, such as on patchy ice for example. Cadence braking maximizes the time for the driver to steer around the obstacle ahead, as it allows the driver to steer while slowing.

ABS generally offers improved vehicle control and decreases stopping distances on dry and slippery surfaces; however, on loose gravel or snow-covered surfaces, ABS can significantly increase braking distance, although still improving vehicle steering control.

"Backup Camera" generally refers to a rear facing camera mounted to a vehicle or trailer for the purpose of capturing images of the area directly behind the vehicle.

"Brake Lamp" or "Stop Lamp" generally refers to a lamp mounted at or near the rear of a vehicle or trailer that is configured to illuminate when the vehicle or trailer brakes are applied so as to warn others that the vehicle is slowing. Brake lamps are commonly mounted at the rear of the vehicle or trailer and are generally configured to emit red light. As used herein, the term generally refers to a stop lamp which is compliant with present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108

"Brake Mode" generally refers to a specific vehicle mode that is activated when the vehicle is slowed by an application of the braking system. This mode may be activated only briefly e.g. tapping the brakes or it may be activated and held for any amount of time e.g. sitting in stopped traffic.

"Cable" generally refers to one or more elongate strands of material that may be used to carry electromagnetic or electrical energy. A metallic or other electrically conductive material may be used to carry electric current. In another example, strands of glass, acrylic, or other substantially transparent material may be included in a cable for carrying light such as in a fiber-optic cable. A cable may include connectors at each end of the elongate strands for connecting to other cables to provide additional length. A cable is generally synonymous with a node in an electrical circuit and provides connectivity between elements in a circuit but does not include circuit elements. Any voltage drop across a cable is therefore a function of the overall resistance of the material used.

A cable may include a sheath or layer surrounding the cable with electrically non-conductive material to electrically insulate the cable from inadvertently electrically connecting with other conductive material adjacent the cable.

A cable may include multiple individual component cables, wires, or strands, each with, or without, a non-conductive sheathing. A cable may also include a non-conductive sheath or layer around the conductive material, as well as one or more layers of conductive shielding material around the non-conductive sheath to capture stray electromagnetic energy that may be transmitted by electromagnet signals traveling along the conductive material of the cable, and to insulate the cable from stray electromagnetic energy that may be present in the environment the cable is passing through. Examples of cables include twisted pair cable, coaxial cable, "twin-lead", fiber-optic cable, hybrid optical and electrical cable, ribbon cables with multiple side-by-side wires, and the like.

"Cable System" generally refers to one or more cables configured to operate together to achieve a result. For example, a cable system includes multiple cables or conductors operating together to carry electromagnetic energy. Examples of this include twisted pair network cables for carrying data over a network, coaxial cable carrying radio signals from a transmitter to an antenna, multiple wires carrying power to different parts of a vehicle such as a truck or a trailer, or three-wire AC wiring such as what is commonly found in homes for the purpose of carrying power. Cable systems may also be used to achieve a result in a mechanical context, such as in the case of a cable-stayed bridge where one or more cables are used to support a bridge, or in the case of a crane that may use one or more cables to lift and/or move a load.

"Cargo Sensor" generally refers to sensors configured to determine whether at least a portion of a trailer is loaded or unloaded. Any suitable sensing technology may be used for this purpose. Examples include cargo sensors that use ultrasonic detection, optical image analysis of the cargo area, or laser time-of-flight measurements for detecting the presence of cargo within a cargo area.

"Computer" generally refers to any computing device configured to compute a result from any number of input values or variables. A computer may include a processor for performing calculations to process input or output. A computer may include a memory for storing values to be processed by the processor, or for storing the results of previous processing.

A computer may also be configured to accept input and output from a wide array of input and output devices for receiving or sending values. Such devices include other computers, keyboards, mice, visual displays, printers, industrial equipment, and systems or machinery of all types and sizes. For example, a computer can control a network or network interface to perform various network communications upon request. The network interface may be part of the computer, or characterized as separate and remote from the computer.

A computer may be a single, physical, computing device such as a desktop computer, a laptop computer, or may be composed of multiple devices of the same type such as a group of servers operating as one device in a networked cluster, or a heterogeneous combination of different computing devices operating as one computer and linked together by a communication network. The communication network connected to the computer may also be connected to a wider network such as the internet. Thus a computer may include one or more physical processors or other computing devices or circuitry, and may also include any suitable type of memory.

A computer may also be a virtual computing platform having an unknown or fluctuating number of physical processors and memories or memory devices. A computer may thus be physically located in one geographical location or physically spread across several widely scattered locations with multiple processors linked together by a communication network to operate as a single computer.

The concept of "computer" and "processor" within a computer or computing device also encompasses any such processor or computing device serving to make calculations or comparisons as part of the disclosed system. Processing operations related to threshold comparisons, rules comparisons, calculations, and the like occurring in a computer may occur, for example, on separate servers, the same server with separate processors, or on a virtual computing environment having an unknown number of physical processors as described above.

A computer may be optionally coupled to one or more visual displays and/or may include an integrated visual display. Likewise, displays may be of the same type, or a heterogeneous combination of different visual devices. A computer may also include one or more operator input devices such as a keyboard, mouse, touch screen, laser or infrared pointing device, or gyroscopic pointing device to name just a few representative examples. Also, besides a display, one or more other output devices may be included such as a printer, plotter, industrial manufacturing machine, 3D printer, and the like. As such, various display, input and output device arrangements are possible.

Multiple computers or computing devices may be configured to communicate with one another or with other devices over wired or wireless communication links to form a network. Network communications may pass through various computers operating as network appliances such as switches, routers, firewalls or other network devices or interfaces before passing over other larger computer networks such as the internet. Communications can also be passed over the network as wireless data transmissions carried over electromagnetic waves through transmission lines or free space. Such communications include using WiFi or other Wireless Local Area Network (WLAN) or a cellular transmitter/receiver to transfer data.

"Communications cable" generally refers to a cable configured to carry digital or analog signals.

"Communication Link" generally refers to a connection between two or more communicating entities and may or may not include a communications channel between the communicating entities. The communication between the communicating entities may occur by any suitable means. For example, the connection may be implemented as a physical link, an electrical link, an electromagnetic link, a logical link, or any other suitable linkage facilitating communication.

In the case of a physical link, communication may occur by multiple components in the communication link configured to respond to one another by physical movement of one element in relation to another. In the case of an electrical link, the communication link may be composed of multiple electrical conductors electrically connected to form the communication link.

In the case of an electromagnetic link, the connection may be implemented by sending or receiving electromagnetic energy at any suitable frequency, thus allowing communications to pass as electromagnetic waves. These electromagnetic waves may or may not pass through a physical medium such as an optical fiber, or through free space via one or more sending and receiving antennas, or any combination thereof. Electromagnetic waves may be passed at any suitable frequency including any frequency in the electromagnetic spectrum.

A communication link may include any suitable combination of hardware which may include software components as well. Such hardware may include routers, switches, networking endpoints, repeaters, signal strength enters, hubs, and the like.

In the case of a logical link, the communication link may be a conceptual linkage between the sender and recipient such as a transmission station in the receiving station. Logical link may include any combination of physical, electrical, electromagnetic, or other types of communication links.

"Comparison Logic" generally refers to software or electronic circuits configured to compare two or more values and determine a result based on one or more rules. The rules may be encoded as software executed on a processor in a computer, or encoded by an arrangement of digital or analog logic gates or circuits. Examples include if-then decision trees, comparisons made based on the relationships between sets of values, decision logic implemented in a neural network, fuzzy logic for determine partial truth results, and the like.

"Control Area Network (CAN)" or "CAN bus" generally refers to a communication system and network protocol that may be used for intercommunication between components or subsystems of a vehicle. A CAN (sometimes referred to colloquially as a "CAN bus") allows one or more microcontrollers or CAN enabled devices to communicate with each other in real time without a host computer. A CAN may physically connect all nodes together through a two wire bus. The wires may be a twisted pair cable with a 120 ohm characteristic impedance. These wires may be thought of as "high" and "low" connections.

CAN may be thought of as an example of a multi-master serial bus for connecting Electronic Control Units (ECUs) also referred to as "nodes". Two or more nodes are required on the CAN network to communicate. The complexity of the node can range from a simple I/O device such as a sensor, an active device such as a lamp, transmission, or brake actuator, or an embedded computer or ECU with a CAN interface. A node may also be a gateway allowing a standard computer to communicate over a network connection such as a Universal Serial Bus (USB) or Ethernet port allowing outside devices to be selectively added or removed from the CAN network.

A CAN bus does not require any addressing schemes, as the nodes of the network use unique identifiers that may be provided by programming the individual node before use, or reprogramming between uses. This provides the nodes with information regarding the priority and the urgency of transmitted message.

Each node may include a central processing unit, microprocessor, or host processor. The host processor may be configured to determine what the received messages mean and what messages to transmit in response. A node may be electrically connect to sensors, actuators, lamps, or other electronic devices that can be connected to the host processor. A node may also include a CAN controller, optionally integrated into the microcontroller. The can control may implement the sending and receiving protocols. When receiving, the CAN controller may store the received serial bits from the bus until an entire message is available, which can then be fetched by the host processor (for example, by the CAN controller triggering an interrupt). When sending, the host processor may send the transmit message(s) to the CAN controller, which transmits the bits serially onto the bus when the bus is free. A node may also include a transceiver. When receiving: the transceiver may convert the data stream from CAN bus levels to levels that the CAN controller uses. It may have protective circuitry to protect the CAN controller. When transmitting, the transceiver may convert the data stream from the CAN controller to CAN bus levels.

Each node may be configured to send and receive messages, but not simultaneously. A message or Frame consists primarily of the ID (identifier), which represents the priority of the message, and up to eight data bytes. A CRC, acknowledge slot (ACK) and other overhead are also part of the message. The improved CAN FD extends the length of the data section to up to 64 bytes per frame. The message is transmitted serially onto the bus using a non-return-to-zero (NRZ) format and may be received by all nodes.

CAN data transmission may use a lossless bitwise arbitration method of contention resolution. This arbitration method may require all nodes on the CAN network to be synchronized to sample every bit on the CAN network at the same time. Thus data may be transmitted without a clock signal in an asynchronous format.

The CAN specifications may use the terms "dominant" bits and "recessive" bits where dominant is a logical 0 (actively driven to a voltage by the transmitter) and recessive is a logical 1 (passively returned to a voltage by a resistor). The idle state may be represented by the recessive level (logical 1). If one node transmits a dominant bit and another node transmits a recessive bit then a collision results and the dominant bit "wins". This means there is no delay to the higher-priority message, and the node transmitting the lower priority message automatically attempts to retransmit, for example, six bit clocks after the end of the dominant message.

All nodes on the CAN network generally operate at the same nominal bit rate, but noise, phase shifts, oscillator tolerance and oscillator drift mean that the actual bit rate may not be the same as the nominal bit rate. Since a separate clock signal is not used, a means of synchronizing the nodes is used. Synchronization is helpful during arbitration since the nodes in arbitration may see both their transmitted data and the other nodes' transmitted data at the same time. Synchronization is also helpful to ensure that variations in oscillator timing between nodes do not cause errors.

Synchronization may start with a hard synchronization on the first recessive to dominant transition after a period of bus idle (the start bit). Resynchronization may occur on every recessive to dominant transition during the frame. The CAN controller may expect the transition to occur at a multiple of the nominal bit time. If the transition does not occur at the exact time the controller expects it, the controller adjusts the nominal bit time accordingly.

Examples of lower-layer (e.g. levels 1 and 2 of the ISO/OSI model), are commercially available from the International Standardization Organization (ISO) and include ISO 11898-1 through 11898-6, as well as ISO 16845-1 and 16845-2.

CAN standards may not include application layer protocols, such as flow control, device addressing, and transportation of data blocks larger than one message, as well as, application data. Other CAN standards are available that are optimized for specific fields of use. These include, but are not limited to:

ARINC 812 or ARINC 825 (for the aviation industry)
CANopen—EN 50325-4 (used for industrial automation)
DeviceNet (used for industrial automation)
EnergyBus—CiA 454 (used for light electrical vehicles)
ISOBUS—ISO 11783 (agriculture)
ISO-TP—ISO 15765-2 (Transport protocol for automotive diagnostic)
SAE J1939 (In-vehicle network for buses and trucks)
MilCAN
NMEA 2000—IEC 61162-3 (marine industry)
Unified Diagnostic Services (UDS)—ISO 14229 (automotive diagnostics)
CANaerospace—Stock (for the aviation industry)
CAN Kingdom—Kvaser (embedded control system)
CCP/XCP (automotive ECU calibration)
GMLAN—General Motors (for General Motors)
RV-C—RVIA (used for recreational vehicles)
SafetyBUS p—Pilz (used for industrial automation)
UAVCAN (aerospace and robotics)

"Controller" or "Control Circuit" generally refers to a mechanical or electronic device configured to control the behavior of another mechanical or electronic device. A controller or a control circuit may be configured to provide signals or other electrical impulses that may be received and interpreted by the controlled device to indicate how it should behave. Controllers or control circuits may control other controllers or control circuits such as in a master-slave configuration where the master is configured to control a slave based on input from the master.

"Control Logic" generally refers to hardware or software configured to implement an automatic decision making process by which inputs are considered, and corresponding outputs are generated. The output may be used for any suitable purpose such as to provide specific commands to machines or processes specifying specific actions to take. Examples of control logic include computer programs executed by a processor to accept commands from a user and generate output according to the logic implemented in the program as executed by the processor. In another example, control logic may be implemented as a series of logic gates, microcontrollers, and the like, electrically connected together in a predetermined arrangement so as to accept input from other circuits or computers and produce an output according to the rules implemented in the logic circuits.

"Data" generally refers to one or more values of qualitative or quantitative variables that are usually the result of measurements. Data may be considered "atomic" as being finite individual units of specific information. Data can also be thought of as a value or set of values that includes a frame of reference indicating some meaning associated with the values. For example, the number "2" alone is a symbol that absent some context is meaningless. The number "2" may be considered "data" when it is understood to indicate, for example, the number of items produced in an hour.

Data may be organized and represented in a structured format. Examples include a tabular representation using rows and columns, a tree representation with a set of nodes considered to have a parent-children relationship, or a graph representation as a set of connected nodes to name a few.

The term "data" can refer to unprocessed data or "raw data" such as a collection of numbers, characters, or other symbols representing individual facts or opinions. Data may be collected by sensors in controlled or uncontrolled environments, or generated by observation, recording, or by processing of other data. The word "data" may be used in a plural or singular form. The older plural form "datum" may be used as well.

"Divert" generally refers to causing a change in course or turn from one direction to another, and generally involves causing the flow in the original direction to be reduced or eliminated.

"Door Sensor" generally refers to a sensor configured to detect whether a door is open or closed. Such sensors may be installed in vehicles, homes, businesses, and may be part of a security or monitoring system. Such sensors may include optical or mechanical switches, proximity sensors, or other such devices for detecting the position of a door from an open versus closed configuration.

"Downstream" generally refers to a direction away from a source. For example, current in a circuit may flow "downstream" from a battery to a lamp, with the lamp being down stream of the battery. In a networking example, the term generally refers to a flow of packets, signals, data, and the like moving from a source to a recipient. In a mechanical context, a driven gear is "downstream" in the flow of mechanical power from a driving gear which turns the driven gear.

"Electrically connected" generally refers to a configuration of two objects that allows electricity to flow between them or through them. In one example, two conductive materials are physically adjacent one another and are sufficiently close together so that electricity can pass between them. In another example, two conductive materials are in physical contact allowing electricity to flow between them.

"Ground" or "circuit ground" generally refers to a node in an electrical circuit that is designated as a reference node for other nodes in a circuit. It is a reference point in an electrical circuit from which voltages are measured, a common return path for electric current, and/or a direct physical connection to the Earth.

"Ground cable" generally refers to a cable electrically connecting to a circuit ground.

"Institute of Electrical and Electronics Engineers (IEEE) 802.15.4 Standard" generally refers to a standard for low data rate solution with multi-month to multi-year battery life and very low complexity. It is operating in an unlicensed, international frequency band. Potential applications are sensors, interactive toys, smart badges, remote controls, and home automation.

The features of the standard include: Data rates of 250 kbps, 40 kbps, and 20 kbp, Two addressing modes; 16-bit short and 64-bit IEEE addressing, Support for critical latency devices, such as joysticks, CSMA-CA channel access, Automatic network establishment by the coordinator, Full handshaking protocols for transfer reliability, Power management to ensure low power consumption, 16 channels in the 2.4 GHz ISM band, 10 channels in the 915 MHz I and one channel in the 868 MHz band.

"J-560 Compliant cabling system" generally refers to a cable system with multiple individual wires forming separate circuits in a truck trailer conforming to the Society of Automotive Engineers (SAE) J-560 standard. The J-560 standard requires an 8 AWG chassis ground wire, typically colored white, a 10 AWG wire (typically red) that is dedicated to brake or stop lamps, and a 10 AWG wire (often blue) that is dedicated to provide continuous ABS primary power and, alternatively, power for auxiliary devices. Four 12 AWG wires are commonly included (such as the yellow, green, brown, and black) wires, with the yellow wire dedicated to the left turn signal and hazard lamps, the green wire dedicated to the right turn signal and hazard lamps, the brown wire dedicated for tail and license plates and clearance and/or side marker lamps, and the black wire dedicated for clearance, side marker, and identification lamps. Thus, the conventional J-560 compliant cable system has an aggregate cross-sectional area of about 32 mm$^2$ calculated as the aggregate of four metallic 12 AWG cables each with a cross-sectional area of 3.3 mm$^2$, two metallic 10 AWG cables each with a cross-sectional area of 5.3 mm$^2$, one metallic 8 AWG cables each with a cross-sectional area of 8.4 mm$^2$.

"Lamp" generally refers to an electrical device configured to produce light using electrical power. The generated light may be in the visible range, ultraviolet, infrared, or other light. Example illumination technologies that may be employed in a lamp include, but are not limited to, incandescent, halogen, LED, fluorescent, carbon arc, xenon arc, metal-hallide, mercury-vapor, sulfur, neon, sodium-vapor, or others.

"Light Emitting Diode" or "LED" generally refers to a diode that is configured to emit light when electrical power passes through it. The term may be used to refer to single diodes as well as arrays of LED's and/or grouped light emitting diodes. This can include the die and/or the LED film or other laminate, LED packages, said packages may include encapsulating material around a die, and the material, typically transparent, may or may not have color tinting and/or may or may not have a colored sub-cover. An LED can be a variety of colors, shapes, sizes and designs, including with or without heat sinking, lenses, or reflectors, built into the package.

"Liquid Level Sensor" generally refers to a sensor to measure the depth of liquid in a container. Examples include optical level switches, ultrasonic sensors, float switches, and conductive sensors to name a few non-limiting examples.

"LED Lamp" generally refers to an electrical device that uses Light Emitting Diodes (LEDs) to produce light using electrical power. A lamp may include a single LED, or multiple LEDs.

"Local Interconnect Network (LIN)" generally refers to a network protocol used for communication between components in vehicles, usually by means of serial communication. LIN may be used also over the vehicle's battery power-line with a special LIN over DC powerline (DC-LIN) transceiver. Features of the protocol include, but are not limited to a single master, up to 16 slaves, Slave Node Position Detection (SNPD) that allows node address assignment after power-up, single wire communications greater than 19.2 Kbits/s with a bus length of 40 meters or less, guaranteed latency times, variable length of data frame (2, 4 and 8 byte frames), multi-cast reception with time synchronization, without crystals or ceramic resonators, data checksum and error detection, detection of defective nodes, and an operating voltage of 12V.

A LIN may be implemented as a single-wire network such as an asynchronous serial network described on ISO 9141. A microcontroller may generate all needed LIN data by software and is connected to the LIN network via a LIN transceiver. The LIN Master may use one or more predefined scheduling tables to start sending and receiving to the LIN bus. These scheduling tables contain relative timing information, where the message sending is initiated. One LIN Frame consists of the two parts header and response. The header is always sent by the LIN Master, while the response is sent by either one dedicated LIN-Slave or the LIN master itself.

Transmitted data within the LIN is transmitted serially as eight bit data bytes with one start bit, one stop-bit, and no parity (break field does not have a start bit and stop bit). Bit rates vary within the range of 1 kbit/s to 20 kbit/s, or more. Data on the bus is divided into recessive (logical HIGH) and dominant (logical LOW). The time normal is considered by the LIN Masters stable clock source, the smallest entity is one bit time (e.g. 52 us at 19.2 kbit/s).

Data may be transferred across the bus in fixed form messages of selectable lengths. The master task may transmit a header that consists of a break signal followed by synchronization and identifier fields. The slaves may respond with a data frame that consists of between 2, 4 and 8 data bytes plus 3 bytes of control information. Frame types include, unconditional frame, Event-triggered frame, Sporadic frame, Diagnostic frame, User-defined frame, Reserved frame. One example of a standard LIN is maintained by the International Organization for Standardization (ISO) as ISO/AWI 17987

"Leakage Current" generally refers to an electric current through an unwanted conductive path in a circuit. It generally involves the gradual transfer of electrical energy across a boundary normally viewed as insulating, such as the spontaneous discharge of a charged capacitor, magnetic coupling of a transformer with other components, a flow of current across a transistor in the "off" state, or current flowing from the cathode to an anode of a diode (i.e. reverse polarized). Leakage current can also be caused by corrosion or oxidation on mechanical parts in an electric circuit such as in the case of corrosion on wiring caused by breaks in protective shielding, oxidation on the contacts of switches or relays, and the like.

"Master/Slave" generally refers to a model for a communication protocol in which one device or process (known as the master) controls one or more other devices or processes (known as slaves). In some implementations, such as in a Local Interconnect Network (LIN) only one node in a communication network may operate as a master and once the master/slave relationship is established, the direction of control is always from the master to the slave(s). In other examples, such as in the case of a Control Area Network (CAN), the concept of a master and slave is less strict because all nodes on the CAN may operate as a "master" issuing commands to other "master" nodes. As used herein, a master sends commands to a slave, irrespective of whether the networking protocol used strictly adheres to this requirement.

"Long Range Protocol (LoRa)" generally refers to a wireless protocol designed specifically for long-range, low-power communications. LoRa stands for Long Range Radio and is mainly targeted for machine to machine (M2M) and internet of things (IoT) networks. This technology enables public or multi-tenant networks to connect a number of applications running on the same network. Each LoRa gateway has the ability to handle up to millions of nodes. The signals can span a significant distance, which means that there is less infrastructure required, making constructing a network much cheaper and faster to implement. LoRa also features an adaptive data rate algorithm to help maximize the nodes battery life and network capacity. The LoRa protocol includes a number of different layers including encryption at the network, application and device level for secure communications. LoRa uses license-free sub-giga-hertz radio frequency bands like 433 MHz, 868 MHz (Europe) and 915 MHz (Australia and North America). LoRa enables long-range transmissions (more than 10 km in rural areas) with low power consumption. The technology is presented in two parts: LoRa, the physical layer and LoRaWAN (Long Range Wide Area Network), the upper layers. LoRa devices have geolocation capabilities used for triangulating positions of devices via timestamps from gateways. LoRa and LoRaWAN permit long-range connectivity for Internet of Things (IoT) devices in different types of industries. LoRa uses a proprietary spread spectrum modulation that is similar to and a derivative of Chirp spread spectrum (CSS) modulation. This allows LoRa to trade off data rate for sensitivity with a fixed channel bandwidth by selecting the amount of spread used (a selectable radio parameter from 7 to 12). This spreading factor determines the data rate and dictates the sensitivity of a radio. In addition, LoRa uses Forward Error Correction coding to improve resilience against interference. LoRa's high range is characterized by extremely high wireless link budgets, around 155 dB to 170 dB. Since LoRa defines the lower physical layer, the upper networking layers were lacking. LoRaWAN is one of several protocols that were developed to define the upper layers of the network. LoRaWAN is a cloud-based media access control (MAC) layer protocol but acts mainly as a network layer protocol for managing communication between low-power wide-area network (LP-WAN) gateways and end-node devices as a routing protocol, maintained by the LoRa Alliance. LoRaWAN defines the communication protocol and system architecture for the network, while the LoRa physical layer enables the long-range communication link. LoRaWAN is also responsible for managing the communication frequencies, data rate, and power for all devices. Devices in the network are asynchronous and transmit when they have data available to send. Data transmitted by an end-node device is received by multiple gateways, which forward the data packets to a centralized network server. The network server filters duplicate packets, performs security checks, and manages the network. Data is then forwarded to application servers. The technology shows high reliability for the moderate load. The LoRa Alliance is an association created in 2015 to support LoRaWAN (long range wide-area network) protocol as well as ensure interoperability of all LoRaWAN products and technologies.

"Memory" generally refers to any storage system or device configured to retain data or information. Each memory may include one or more types of solid-state electronic memory, magnetic memory, or optical memory, just to name a few. Memory may use any suitable storage technology, or combination of storage technologies, and may be volatile, nonvolatile, or a hybrid combination of volatile and nonvolatile varieties. By way of non-limiting example, each memory may include solid-state electronic Random Access Memory (RAM), Sequentially Accessible Memory (SAM) (such as the First-In, First-Out (FIFO) variety or the Last-In-First-Out (LIFO) variety), Programmable Read Only Memory (PROM), Electronically Programmable Read Only Memory (EPROM), or Electrically Erasable Programmable Read Only Memory (EEPROM).

Memory can refer to Dynamic Random Access Memory (DRAM) or any variants, including static random access memory (SRAM), Burst SRAM or Synch Burst SRAM (BSRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (REDO DRAM), Single Data Rate Synchronous DRAM (SDR SDRAM), Double Data Rate SDRAM (DDR SDRAM), Direct Rambus DRAM (DRDRAM), or Extreme Data Rate DRAM (XDR DRAM).

Memory can also refer to non-volatile storage technologies such as non-volatile read access memory (NVRAM), flash memory, non-volatile static RAM (nvSRAM), Ferroelectric RAM (FeRAM), Magnetoresistive RAM (MRAM), Phase-change memory (PRAM), conductive-bridging RAM (CBRAM), Silicon-Oxide-Nitride-Oxide-Silicon (SONOS), Resistive RAM (RRAM), Domain Wall Memory (DWM) or "Racetrack" memory, Nano-RAM (NRAM), or Millipede memory. Other non-volatile types of memory include optical disc memory (such as a DVD or CD ROM), a magnetically encoded hard disc or hard disc platter, floppy disc, tape, or cartridge media. The concept of a "memory" includes the use of any suitable storage technology or any combination of storage technologies.

"Metallic" generally refers to a material that includes a metal, or is predominately (50% or more by weight) a metal. A metallic substance may be a single pure metal, an alloy of two or more metals, or any other suitable combination of metals. The term may be used to refer to materials that include nonmetallic substances. For example, a metallic cable may include one or more strands of wire that are predominately copper sheathed in a polymer or other non-conductive material.

"Microcontroller" or "MCU" generally refers to a small computer on a single integrated circuit. It may be similar to, but less sophisticated than, a System on a Chip or "SoC"; an SoC may include a microcontroller as one of its components. A microcontroller may contain one or more CPUs (processor cores) along with memory and programmable input/output peripherals. Program memory in the form of ferroelectric RAM, NOR flash or OTP ROM may also be included on the chip, as well as a small amount of RAM. Microcontrollers may be designed for embedded applications, in contrast to the microprocessors used in personal computers or other general purpose applications consisting of various discrete chips.

Microcontrollers may be included in automatically controlled products and devices, such as automobile engine control systems, implantable medical devices, remote controls, office machines, appliances, power tools, toys and other embedded systems. An MCU may be configured to handle mixed signals thus integrating analog components needed to control non-digital electronic systems.

Some microcontrollers may use four-bit words and operate at frequencies as low as 4 kHz, for low power consumption (single-digit milliwatts or microwatts). They will generally have the ability to retain functionality while waiting for an event such as a button press or other interrupt; power consumption while sleeping (CPU clock and most peripherals off) may be just nanowatts, making many of them well suited for long lasting battery applications. Other microcontrollers may serve performance roles, where they may need to act more like a Digital Signal Processor (DSP), with higher clock speeds and power consumption. A microcontroller may include any suitable combination of circuits such as:

1. a central processing unit—ranging from small and simple processors with registers as small as 4 bits or list, to complex processors with registers that are 32, 64, or more bits
2. volatile memory (RAM) for data storage
3. ROM, EPROM, EEPROM or Flash memory for program and operating parameter storage
4. discrete input and output bits, allowing control or detection of the logic state of an individual package pin
5. serial input/output such as serial ports (UART5)
6. other serial communications interfaces like I²C, Serial Peripheral Interface and Controller Area Network for system interconnect
7. peripherals such as timers, event counters, PWM generators, and watchdog
8. clock generator—often an oscillator for a quartz timing crystal, resonator or RC circuit
9. many include analog-to-digital converters, some include digital-to-analog converters
10. in-circuit programming and in-circuit debugging support "Network" or "Computer Network" generally refers to a telecommunications network that allows computers to exchange data. Computers can pass data to each other along data connections by transforming data into a collection of datagrams or packets. The connections between computers and the network may be established using either cables, optical fibers, or via electromagnetic transmissions such as for wireless network devices.

Computers coupled to a network may be referred to as "nodes" or as "hosts" and may originate, broadcast, route, or accept data from the network. Nodes can include any computing device such as personal computers, phones, servers as well as specialized computers that operate to maintain the flow of data across the network, referred to as "network devices". Two nodes can be considered "networked together" when one device is able to exchange information with another device, whether or not they have a direct connection to each other.

Examples of wired network connections may include Digital Subscriber Lines (DSL), coaxial cable lines, or optical fiber lines. The wireless connections may include BLUETOOTH, Worldwide Interoperability for Microwave Access (WiMAX), infrared channel or satellite band, or any wireless local area network (Wi-Fi) such as those implemented using the Institute of Electrical and Electronics Engineers' (IEEE) 802.11 standards (e.g. 802.11(a), 802.11 (b), 802.11(g), or 802.11(n) to name a few). Wireless links may also include or use any cellular network standards used to communicate among mobile devices including 1G, 2G, 3G, or 4G. The network standards may qualify as 1G, 2G, etc. by fulfilling a specification or standards such as the specifications maintained by International Telecommunication Union (ITU). For example, a network may be referred to as a "3G network" if it meets the criteria in the International Mobile Telecommunications-2000 (IMT-2000) specification regardless of what it may otherwise be referred to. A network may be referred to as a "4G network" if it meets the requirements of the International Mobile Telecommunications Advanced (IMTAdvanced) specification. Examples of cellular network or other wireless standards include AMPS, GSM, GPRS, UMTS, LTE, LTE Advanced, Mobile WiMAX, and WiMAX-Advanced.

Cellular network standards may use various channel access methods such as FDMA, TDMA, CDMA, or SDMA. Different types of data may be transmitted via different links and standards, or the same types of data may be transmitted via different links and standards.

The geographical scope of the network may vary widely. Examples include a body area network (BAN), a personal area network (PAN), a low power wireless Personal Area Network using IPv6 (6LoWPAN), a local-area network (LAN), a metropolitan area network (MAN), a wide area network (WAN), or the Internet.

A network may have any suitable network topology defining the number and use of the network connections. The network topology may be of any suitable form and may include point-to-point, bus, star, ring, mesh, or tree. A network may be an overlay network which is virtual and is configured as one or more layers that use or "lay on top of" other networks.

A network may utilize different communication protocols or messaging techniques including layers or stacks of protocols. Examples include the Ethernet protocol, the internet protocol suite (TCP/IP), the ATM (Asynchronous Transfer Mode) technique, the SONET (Synchronous Optical Networking) protocol, or the SDE1 (Synchronous Digital Elierarchy) protocol. The TCP/IP internet protocol suite may include application layer, transport layer, internet layer (including, e.g., IPv6), or the link layer.

"Nosebox" generally refers to an enclosure that serves a junction for electronic circuits and/or physical connections running between a truck and a trailer. The nosebox is generally located towards the front of the trailer, but may be positioned in any suitable location on the trailer. The nosebox can be one single enclosure, or may include multiple separate enclosures located in the same or in separate locations located on the trailer. The nosebox generally provides a common ground circuit between the truck and the trailer cable system. It may also provide a single location on the trailer by which the trailer cable system may electrically connect with one or more power circuits provided by the truck. For example, a nose box may provide a J-560 compliant connection, or alternatively, a nose box may include a four pin, five pin, or other similar connections.

"Optionally" as used herein means discretionary; not required; possible, but not compulsory; left to personal choice.

"Optionally" as used herein means discretionary; not required; possible, but not compulsory; left to personal choice.

"Predominately" as used herein is synonymous with greater than 50%.

"Pressure Sensor" generally refers to a device configured to detect pressure applied to the device. Such devices generally include a pressure sensitive element to determine the actual pressure applied to the sensor and may also include components configured to convert this information into an output signal. Examples of pressure sensors include strain gauge based sensors, capacitive sensors, piezo-resistive pressure sensors, resonant pressure sensors and the like.

"Processor" generally refers to one or more electronic components configured to operate as a single unit configured or programmed to process input to generate an output. Alternatively, when of a multi-component form, a processor may have one or more components located remotely relative to the others. One or more components of each processor may be of the electronic variety defining digital circuitry, analog circuitry, or both. In one example, each processor is of a conventional, integrated circuit microprocessor arrangement, such as one or more PENTIUM, i3, i5 or i7 processors supplied by INTEL Corporation of Santa Clara, Calif., USA. Other examples of commercially available processors include but are not limited to the X8 and Freescale Coldfire processors made by Motorola Corporation of Schaumburg, Ill., USA; the ARM processor and TEGRA System on a Chip (SoC) processors manufactured by Nvidia of Santa Clara, Calif., USA; the POWER7 processor manufactured by International Business Machines of White Plains, N.Y., USA; any of the FX, Phenom, Athlon, Sempron, or Opteron processors manufactured by Advanced Micro Devices of Sunnyvale, Calif., USA; or the Snapdragon SoC processors manufactured by Qalcomm of San Diego, Calif., USA.

A processor also includes Application-Specific Integrated Circuit (ASIC). An ASIC is an Integrated Circuit (IC) customized to perform a specific series of logical operations is controlling a computer to perform specific tasks or functions. An ASIC is an example of a processor for a special purpose computer, rather than a processor configured for general-purpose use. An application-specific integrated circuit generally is not reprogrammable to perform other functions and may be programmed once when it is manufactured.

In another example, a processor may be of the "field programmable" type. Such processors may be programmed multiple times "in the field" to perform various specialized or general functions after they are manufactured. A field-programmable processor may include a Field-Programmable Gate Array (FPGA) in an integrated circuit in the processor. FPGA may be programmed to perform a specific series of instructions which may be retained in nonvolatile memory cells in the FPGA. The FPGA may be configured by a customer or a designer using a hardware description language (HDL). In FPGA may be reprogrammed using another computer to reconfigure the FPGA to implement a new set of commands or operating instructions. Such an operation may be executed in any suitable means such as by a firmware upgrade to the processor circuitry.

Just as the concept of a computer is not limited to a single physical device in a single location, so also the concept of a "processor" is not limited to a single physical logic circuit or package of circuits but includes one or more such circuits or circuit packages possibly contained within or across multiple computers in numerous physical locations. In a virtual computing environment, an unknown number of physical processors may be actively processing data, the unknown number may automatically change over time as well.

The concept of a "processor" includes a device configured or programmed to make threshold comparisons, rules comparisons, calculations, or perform logical operations applying a rule to data yielding a logical result (e.g. "true" or "false"). Processing activities may occur in multiple single processors on separate servers, on multiple processors in a single server with separate processors, or on multiple processors physically remote from one another in separate computing devices.

"Power Cable" generally refers to a cable configured to transfer electrical power as part of an electrical circuit. A power cable may be used exclusively to transfer power, or it may be used to also transfer signals, such as in the case of a Power Line Communication (PLC) system.

"Rear-facing" generally refers to facing away from the rear of a vehicle or structure.

"Refrigeration Sensor" generally refers to temperature sensors configured to report temperature data in a refrigerated environment.

"Remote Computing Device" generally refers to a computing device that is located in a separate locating from other devices it may be in communication via any suitable communication link such as a wireless or wired network.

"Reverse Lamp" generally refers to a rear-facing lamp on a vehicle that is configured to illuminate the area behind the vehicle, and to warn others nearby that the vehicle is in the reverse mode and may soon begin moving backward.

"Running Lamp" generally refers to a lamp on a vehicle that is activated to provide others nearby with additional visual cues as to the size of the vehicle and its direction of travel. Such lamps commonly emit white, yellow, or amber light.

"Sensor" generally refers to a transducer configured to sense or detect a characteristic of the environment local to the sensor. For example, sensors may be constructed to detect events or changes in quantities or sensed parameters providing a corresponding output, generally as an electrical or electromagnetic signal. A sensor's sensitivity indicates how much the sensor's output changes when the input quantity being measured changes.

"Sense parameter" generally refers to a property of the environment detectable by a sensor. As used herein, sense parameter can be synonymous with an operating condition, environmental factor, sensor parameter, or environmental condition. Sense parameters may include temperature, air pressure, speed, acceleration, the presence or intensity of sound or light or other electromagnetic phenomenon, the strength and/or orientation of a magnetic or electrical field, and the like.

"Signal" generally refers to a function or means of representing information. It may be thought of as the output of a transformation or encoding process. The concept generally includes a change in the state of a medium or carrier that conveys the information. The medium can be any suitable medium such as air, water, electricity, magnetism, or electromagnetic energy such as in the case of radio waves, pulses of visible or invisible light, and the like.

As used herein, a "signal" implies a representation of meaningful information. Arbitrary or random changes in the state of a carrier medium are generally not considered "signals" and may be considered "noise". For example, arbitrary binary data streams are not considered as signals. On the other hand, analog and digital signals that are representations of analog physical quantities are examples of signals. A signal is commonly not useful without some way to transmit or send the information, and a receiver responsive to the transmitter for receiving the information.

In a communication system, for example, a transmitter encodes a message to a signal, which is carried to a receiver by the communications channel. For example, the words "The time is 12 o'clock" might be the message spoken into a telephone. The telephone transmitter may then convert the sounds into an electrical voltage signal. The signal is transmitted to the receiving telephone by wires, at the receiver it is reconverted into sounds.

Signals may be thought of as "discrete" or "continuous." Discrete-time signals are often referred to as time series in other fields. Continuous-time signals are often referred to as continuous signals even when the signal functions are not continuous, such as in a square-wave signal.

Another categorization is signals which are "discrete-valued" and "continuous-valued". Particularly in digital signal processing a digital signal is sometimes defined as a sequence of discrete values, that may or may not be derived from an underlying continuous-valued physical process. In other contexts, digital signals are defined as the continuous-time waveform signals in a digital system, representing a bit-stream. In the first case, a signal that is generated by means of a digital modulation method may be considered as converted to an analog signal, while it may be considered as a digital signal in the second case.

"Shunt Resistor" generally refers to a low resistance precision resistor used to measure AC or DC electrical currents by the voltage drop those currents create across the resistance.

"Socket" generally refers a device into which something fits in order to electrically and/or physically connect another electrical device to a circuit.

"Stop-tail-turn Lamp" or "STT Lamp" generally refers to a lamp which is compliant with present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108.

"Rear Position Lamp" or "Tail Lamp" generally refers to rear-facing lamps of a vehicle that are generally configured to emit red light. Tail lamps are generally configured to be active when front position lamps are lit, or when the headlamps are on. Rear position lamps may be combined with a vehicle's stop lamps or separate from them. In combined-function installations, the lamps produce brighter red light for the stop lamp function and dimmer red light for the rear position lamp function. As used herein, the term generally refers to a tail lamp which is compliant with present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108.

"Temperature Sensor" generally refers to a device configured to sense temperature. Examples include thermocouples, resistor temperature detectors, thermistors, thermometers, semiconductors, and IR Sensors.

"Terminal" generally refers to a plug, socket or other connection (male, female, mixed, hermaphroditic, or otherwise) for mechanically and electrically connecting two or more wires or other conductors.

"Trailer" generally refers to a vehicle without an engine, often in the form of a flat frame or a container, which can be pulled by another vehicle.

"Transceiver" generally refers to a device that performs both transmitting and receiving functions. Examples include wireless communications devices such as cellular telephones, cordless telephone sets, handheld two-way radios, mobile two-way radios, as well as in the context of computer networking hardware such as in the case of devices configured to transmit and receive data packets. In another example, term is used in reference to transmitter/receiver devices in cable or optical fiber systems.

"Truck" generally refers to a powered truck (also known as a tractor or cab) for pulling a trailer.

"Turn Signal Lamp" generally refers to lamps positioned on a vehicle or trailer to warn of a change in the direction of travel when activated. Sometimes referred to as "direction indicators" or "directional signals", or as "directionals", "blinkers", "indicators" or "flashers"—turn signal lam blinking lamps mounted near the left and right front and rear corners of a vehicle or trailer. As used herein, the term generally refers to a turn signal lamp which is compliant with present legal and/or regulatory requirements for a truck or a trailer such as illuminated surface area, candela, and otherwise. Such regulations include, for example, Title 49 of the U.S. Code of Federal Regulations, section 571.108, also known as Federal Motor Vehicle Safety Standard (FMVSS) 108

"Upstream" generally refers to a direction toward a source and away from a recipient. For example, in a circuit, a battery may be "upstream" from a lamp, with the battery supplying power to the lamp. In a mechanical context, a driving gear is "upstream" in the flow of mechanical power from a driven gear which is turned by the driving gear.

"Vehicle" generally refers to a self-propelled or towed device for transportation, including without limitation, car, truck, bus, boat, tank or other military vehicle, airplane, truck trailer, truck cab, boat trailer, other trailer, emergency vehicle, and motorcycle.

REFERENCE NUMBERS

100 system for detecting circuit anomalies in a trailer
105 power distribution circuit
110 current
115 truck tractor
120 notification
125 trailer
130 master current measuring circuit 135 current
140 internal communications link
145 slave current measuring circuits
150 trailer components
155 notification logic
160 slave current
165 cable system
170 remote computing device
175 communication interface
180 external communication link
185 external communication link
200 system for detecting circuit anomalies in a trailer
205 master current measuring circuit
210 master microcontroller
215 master shunt resistor
220 trunk resistance
225 branch resistance
230 trunk resistance
235 branch resistance
240 anomaly
245 ground circuit
250 first input
255 second input
260 first end
265 second end
270 cable system
275 location
280 location
285 location
286 slave current measuring circuit
287 slave current measuring circuit
290 branch
295 branch
296 trailer component
297 trailer component
300 system for detecting circuit anomalies in a trailer 305 branch
310 slave current measuring circuit
315 switching device
320 trailer component
325 test load
330 slave microcontroller
335 first input
340 first end
345 test shunt resistor
350 second end
355 second input
360 current
400 system for detecting circuit anomalies in a trailer
405 cables
410 nose box
415 terminals
420 ground terminal
425 master current measuring circuit
426 master current measuring circuit
427 master current measuring circuit
428 master current measuring circuit
429 master current measuring circuit
430 master current measuring circuit
435 power distribution circuit
436 power distribution circuit
437 power distribution circuit
438 power distribution circuit
439 power distribution circuit
440 power distribution circuit
445 branch
446 branch
447 branch
448 branch circuit
450 slave current measuring circuit
451 slave current measuring circuit
452 slave current measuring circuit
453 slave current measuring circuit
454 slave current measuring circuit
500 system for detecting circuit anomalies in a trailer
505 nose box
510 master current measuring circuit
515 power distribution circuit
520 slave current measuring circuit
521 slave current measuring circuit
522 slave current measuring circuit
523 slave current measuring circuit
524 slave current measuring circuit
526 branch
527 branch
528 branch
529 branch
530 branch
600 system for detecting circuit anomalies in a trailer
605 master current measuring circuit
610 CAN controller
615 CAN protocol
620 slave current measuring circuit
625 CAN low communication cable
630 CAN high communication cable
635 CAN controller
640 slave current measuring circuit
645 CAN controller
700 method of detecting circuit anomalies
800 trailer components
802 lamp(s)
805 sensors
807 braking system
809 cameras
812 refrigeration system
813 running lamps
815 interior illumination lamps
816 clearance lamps
817 backup lamps
819 license plate lamp(s)
821 stop lamps
823 tail lamps
825 right turn lamps
827 left turn lamps
828 stop-tail-turn
829 temperature sensor
831 door sensor
833 cargo sensor
835 humidity sensor
837 tank level sensor
839 proximity sensor
841 tire pressure sensor
843 Anti-lock Brakes (ABS) controller
845 ABS lamp
847 pressure sensor
849 temperature sensor
851 controller
853 refrigerant level sensor
855 backup camera
857 side camera

What is claimed is:

1. A system for detecting anomalies in electrical wiring in a truck trailer, comprising:

a master current measuring circuit configured to measure a master current indicating current received from a truck tractor, the master current measuring circuit electrically connected upstream from a power distribution circuit of the trailer;

one or more slave current measuring circuits electrically connected to the power distribution circuit downstream from the master current measuring circuit and upstream from one or more trailer components electrically connected to the power distribution circuit, wherein the slave current measuring circuits are:
  a) linked to the master current measuring circuit via an internal communications link;
  b) electrically connected to individual trailer components of the one or more trailer components; and
  c) configured to measure a slave current indicating current passing through the slave current measuring circuit;
  d) configured to selectively disconnect power to one or more trailer components electrically connected to the power distributions circuit downstream from the slave current measuring circuit;

wherein the master current measuring circuit is configured to:
  command the one or more slave current measuring circuits to separately measure the slave current;
  measure the master current when power is disconnected from the one or more trailer components to establish a baseline leakage current for the power distribution circuit; and
  generate a notification of a circuit anomaly when a difference between the master current level and the slave current of one or more individual slaves is greater than a predetermined threshold value.

2. The system of claim 1, wherein the master current measuring circuit comprises:
  a master shunt resistor electrically connected in series upstream from the power distribution circuit; and
  a master microcontroller with a first input electrically connected to a first end of the master shunt resistor, and a second input electrically connected to a second end of the master shunt resistor;
  wherein the master microcontroller is configured to measure current passing through the master shunt resistor.

3. The system of claim 1, wherein the one or more slave current measuring circuits comprises:
  a switching device configured to selectively divert power from an individual branch of the power distribution circuit to a test load;
  a slave shunt resistor electrically connected in series downstream from the test load; and
  a slave microcontroller with a first input electrically connected to a first end of the slave shunt resistor, and a second input electrically connected to a second end of the slave shunt resistor; and
  wherein the slave microcontroller is configured to measure current passing through the slave shunt resistor.

4. The system of claim 3, wherein the test load includes a resistance equivalent to an overall resistance of the one or more trailer components electrically connected to the power distributions circuit downstream from the slave current measuring circuit.

5. The system of claim 3, wherein one or more trailer components includes at least one LED lamp electrically connected to the individual branch, and wherein the switching device is controlled by the slave microcontroller to selectively divert power from the at least one LED lamp to the test load.

6. The system of claim 1, comprising:
  a nosebox mounted to the truck trailer, the nosebox having terminals for connecting six separate power cables and a ground cable to a truck tractor;
  wherein the system includes six separate master current measuring circuits electrically connected to the six separate power cables and to six separate power distribution circuits which are included in the trailer, the six separate distribution circuits having separate one or more slave current measuring circuits.

7. The system of claim 1, comprising:
  a nosebox mounted to the trailer, the nosebox having terminals for connecting six separate power cables and a ground cable to a truck tractor;
  wherein the master current measuring circuit provides power from one or more of the six separate power cables to a single power distribution circuit electrically connected to the one or more trailer components.

8. The system of claim 1, wherein the internal communications link comprises:
  two communication cables electrically connected to the master current measuring circuit;
  wherein the master current measuring circuit includes a master Control Area Network (CAN) controller electrically connected to the communication cables;
  wherein the slave current measuring circuit includes a slave CAN controller electrically connected to the two communication cables; and
  wherein the master and slave current measuring circuits communicate using a CAN protocol.

9. The system of claim 1, wherein the master current measuring circuit comprises:
  a communication circuit configured to establish at least one external communication link with a remote computing device;
  wherein the communication circuit is configured to use the external communication link to send the notification to the remote computing device.

10. The system of claim 9, wherein the at least one external communication link includes at least one of the following, or any combination thereof:
  a Bluetooth wireless communication link that sends the notification according to the Bluetooth protocol,
  a LoRa communication link that sends the notification according to the LoRa protocol,
  a communication link that conforms to the Institute of Electrical and Electronics Engineers (IEEE) 802.15.4 specification,
  a communication link that conforms to any one or more of the IEEE 802.11 family of wireless protocols, and/or
  a cellular telephone communication link.

11. A method of detecting anomalies in electrical wiring in a truck trailer, comprising:
  deactivating one or more trailer components electrically connected to a power distribution circuit in a truck trailer, wherein the one or more trailer components are controlled by one or more slave current measuring circuits, and wherein the slave current measuring circuits are responsive to a master current measuring circuit via an internal communications link;
  using the one or more slave current measuring circuit to measure one or more slave current values indicating current passing through the power distribution circuit at the one or more slave current measuring circuits;

measuring a master current indicating the current passing into the power distribution circuit using a master current measuring circuit;

measuring current passing through a master shunt resistor connected in in series upstream from the power distribution circuit, wherein the current passing through the master shunt resistor is measured using a master microcontroller with a first input electrically connected to a first end of the master shunt resistor, and a second input electrically connected to a second end of the master shunt resistor;

comparing the one or more slave current values to the master current using the master current measuring circuit; and generating a circuit anomaly notification when a difference between at least one of the slave current values and the master current is greater than a predetermined threshold value.

12. The method of claim 11, comprising:

deactivating all of the one or more trailer components using the master current measuring circuit controlling the slave current measuring circuits; and measuring the master current using the master current measuring circuit and saving the master current as a baseline leakage current in a memory of the master current measuring circuit.

13. The method of claim 12, wherein the predetermined threshold value is determined based on the baseline leakage current.

14. The method of claim 11, wherein the action of deactivating one or more trailer components comprises:

diverting power from the one or more trailer components using a switching device configured to selectively divert power from the one or more trailer components to a test load downstream from the switching device.

15. The method of claim 14, wherein measuring the slave current comprises:

measuring current passing through a slave shunt resistor connected in series downstream from the test load, wherein the current passing through the slave shunt resistor is measured using a slave microcontroller with a first input electrically connected to a first end of the slave shunt resistor, and a second input electrically connected to a second end of the slave shunt resistor.

16. The method of claim 11, comprising:

performing the actions specified in claim 12 for each of the one or more trailer components electrically connected to the power distribution circuit.

17. The method of claim 11, wherein the internal communications link comprises:

two communication cables electrically connected to the master current measuring circuit;

wherein the master current measuring circuit includes a master Control Area Network (CAN) controller electrically connected to the communication cables;

wherein the slave current measuring circuit includes a slave CAN controller electrically connected to the two communication cables; and wherein the master controls the slave current measuring circuits using a CAN protocol.

18. The method of claim 11, comprising:

establishing at least one external communication link with a remote device using a communications circuit responsive to the master current measuring circuit;

wherein the communications circuit is configured to use the external communication link to send the circuit anomaly notifications to the remote device.

19. The method of claim 11, wherein the one or more trailer components include vehicle stop-tail-turn lamps, vehicle turn signal lamps, vehicle brake lamps, vehicle tail lamps, vehicle running lamps, vehicle anti-lock brakes, vehicle interior illumination lamps, vehicle reverse lamps, or any combination thereof.

20. The method of claim 11, wherein the one or more trailer components include an antilock brake system controller, pressure sensors, temperature sensors, door sensors, cargo sensors, cargo length sensors, liquid level sensors, refrigeration sensors, or any combination thereof.

\* \* \* \* \*